US012787241B2

(12) United States Patent
Shimizu

(10) Patent No.: US 12,787,241 B2
(45) Date of Patent: Nov. 3, 2026

(54) COMPONENT MOUNTING SYSTEM

(71) Applicant: YAMAHA HATSUDOKI KABUSHIKI KAISHA, Iwata (JP)

(72) Inventor: Hidekazu Shimizu, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 574 days.

(21) Appl. No.: 18/558,716

(22) PCT Filed: May 19, 2021

(86) PCT No.: PCT/JP2021/018973
§ 371 (c)(1),
(2) Date: Nov. 2, 2023

(87) PCT Pub. No.: WO2022/244138
PCT Pub. Date: Nov. 24, 2022

(65) Prior Publication Data
US 2024/0244817 A1 Jul. 18, 2024

(51) Int. Cl.
*H05K 13/08* (2006.01)
*H05K 13/04* (2006.01)

(52) U.S. Cl.
CPC ..... *H05K 13/0813* (2018.08); *H05K 13/0409* (2018.08)

(58) Field of Classification Search
CPC ............ H05K 13/0813; H05K 13/0409; Y10T 29/49131; Y10T 29/53096; Y10T 20/5313;
(Continued)

(56) References Cited

U.S. PATENT DOCUMENTS 8,844,124 B2 * 9/2014 Itose ........................ H05K 9/00 700/121
10,260,996 B2 * 4/2019 Morita ................ H05K 13/083
(Continued)

FOREIGN PATENT DOCUMENTS

JP 2001-223499 A 8/2001
JP 2003-042968 A 2/2003
(Continued)

OTHER PUBLICATIONS

International Search Report issued in PCT/JP2021/018973; mailed Jul. 20, 2021.

*Primary Examiner* — Donghai D Nguyen
(74) *Attorney, Agent, or Firm* — Studebaker Brackett PLLC

(57) ABSTRACT

In a management device, a management storage unit accumulates and stores management data in which suction position offset data, loading position offset data, and parameter information are associated with each other. A management control unit causes a management display unit to simultaneously display suction position offset distribution indicating distribution of a data group of the suction position offset data and loading position offset distribution indicating distribution of a data group of the loading position offset data. The management control unit controls the management display unit such that, when a command to select one or more specific position offset data from the data group of one position offset distribution is input, attention data corresponding to the specific position offset data is displayed in a different display mode from a display mode of residual data in the data group of another position offset distribution.

12 Claims, 13 Drawing Sheets

(58) Field of Classification Search
CPC ..... Y10T 29/531478; Y10T 29/591483; Y10T 29/53191
See application file for complete search history.

(56) References Cited

U.S. PATENT DOCUMENTS

| | | | | |
|---|---|---|---|---|
| 10,806,037 | B2 * | 10/2020 | Taniguchi ................ | H05K 3/30 |
| 2015/0289386 | A1 | 10/2015 | Yamazaki et al. | |
| 2021/0233226 | A1 | 7/2021 | Sugiyama et al. | |

FOREIGN PATENT DOCUMENTS

| | | | |
|---|---|---|---|
| JP | 2013-033791 | A | 2/2013 |
| JP | 2014-135425 | A | 7/2014 |
| WO | 2014/068993 | A1 | 5/2014 |
| WO | 2018/100717 | A1 | 6/2018 |

* cited by examiner

FIG.9

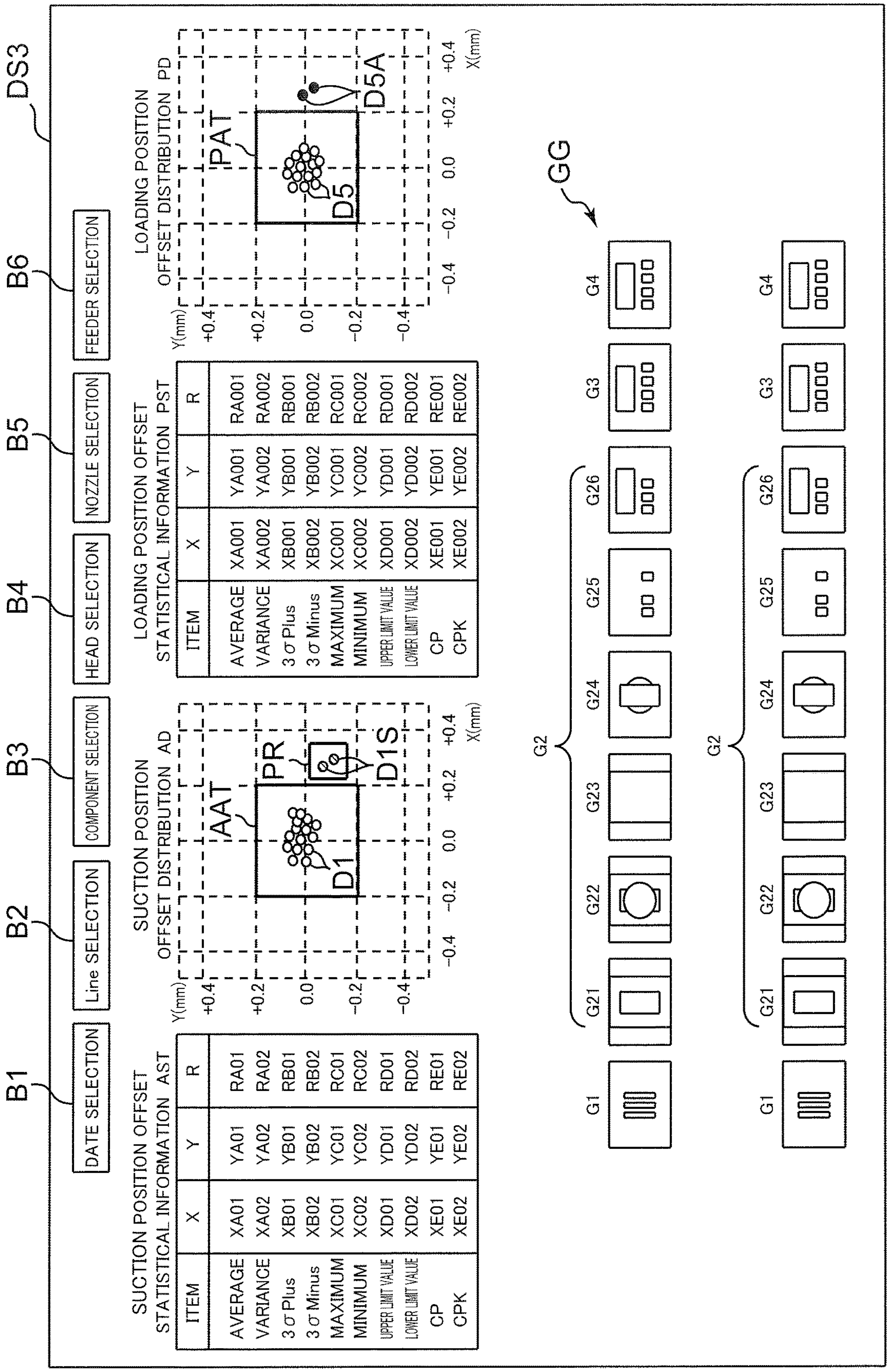

SUCTION POSITION OFFSET STATISTICAL INFORMATION AST

| ITEM | X | Y | R |
|---|---|---|---|
| AVERAGE | XA01 | YA01 | RA01 |
| VARIANCE | XA02 | YA02 | RA02 |
| 3 σ Plus | XB01 | YB01 | RB01 |
| 3 σ Minus | XB02 | YB02 | RB02 |
| MAXIMUM | XC01 | YC01 | RC01 |
| MINIMUM | XC02 | YC02 | RC02 |
| UPPER LIMIT VALUE | XD01 | YD01 | RD01 |
| LOWER LIMIT VALUE | XD02 | YD02 | RD02 |
| CP | XE01 | YE01 | RE01 |
| CPK | XE02 | YE02 | RE02 |

LOADING POSITION OFFSET STATISTICAL INFORMATION PST

| ITEM | X | Y | R |
|---|---|---|---|
| AVERAGE | XA001 | YA001 | RA001 |
| VARIANCE | XA002 | YA002 | RA002 |
| 3 σ Plus | XB001 | YB001 | RB001 |
| 3 σ Minus | XB002 | YB002 | RB002 |
| MAXIMUM | XC001 | YC001 | RC001 |
| MINIMUM | XC002 | YC002 | RC002 |
| UPPER LIMIT VALUE | XD001 | YD001 | RD001 |
| LOWER LIMIT VALUE | XD002 | YD002 | RD002 |
| CP | XE001 | YE001 | RE001 |
| CPK | XE002 | YE002 | RE002 |

COMPONENT MOUNTING SYSTEM

CROSS-REFERENCE TO RELATED APPLICATION

This application claims benefit of priority to International Patent Application No. PCT/JP2021/018973, filed May 19, 2021, the entire contents of which are incorporated herein by reference.

BACKGROUND

Technical Field

The present disclosure relates to a component mounting system equipped with a mounting apparatus that obtains a component loading board with components loaded on a board.

Background Art

Conventionally, a component mounting system has been known that is equipped with a mounting apparatus that obtains a component loading board by loading electronic components (hereinafter simply referred to as "component") on a board such as a printed circuit board. In this kind of component mounting system, the mounting apparatus includes a feeder that executes a component supply process to supply the component, a suction nozzle that executes a component suction process to suck the component supplied by the feeder, and a loading head that executes a component loading process to load the component on the board. The loading head executes the component loading process on each of a plurality of target loading positions that is set in advance on the board.

In the component loading process of the loading head, a position offset may occur between the actual suction position of the component by the suction nozzle (actual suction position) and the target suction position. Such a position offset of the suction position can be a generating factor for the position offset of the actual component loading position (actual loading position) with respect to the target loading position on the board. If the position offset of the actual component loading position occurs on the board, this will affect the quality of the component loading board obtained by the mounting apparatus.

Japanese Patent Application Laid-Open No. 2001-223499 discloses a technique for increasing the positional accuracy of the actual component loading position on the board. In the technique disclosed in Japanese Patent Application Laid-Open No. 2001-223499, a loading head (head unit) that sucks and holds a component with an suction nozzle (jig) captures and recognizes an image of the component while at a standstill at a target loading position (mounting position) on a board. By this image recognition, the positional difference between the central position of the component sucked and held by the suction nozzle and the target loading position is obtained. Then, using the positional difference, calibration of the mounting apparatus is executed for increasing the positional accuracy of the actual component loading position on the board.

Meanwhile, due to aged deterioration of the suction nozzle or the like, the position offset of the actual component suction position may grow beyond an allowable range. In this case, as in the technique disclosed in Japanese Patent Application Laid-Open No. 2001-223499, even if the mounting apparatus is calibrated based on the positional difference between the central position of the component sucked and held by the suction nozzle and the target loading position, there is a possibility that defects of the position offset of the actual component loading position on the board cannot be solved. Since it is difficult for the technique disclosed in Japanese Patent Application Laid-Open No. 2001-223499 to identify the generating factor for the position offset of the actual component suction position by the suction nozzle, it is difficult to take appropriate measures to solve the defects of the position offset of the actual component loading position on the board.

SUMMARY

The present disclosure has been made in view of such circumstances, and provides a component mounting system that can check the generating status of the position offset of the component suction position by the suction nozzle and identify the generating factor for the position offset.

A component mounting system according to one aspect of the present disclosure includes a mounting apparatus including a feeder configured to execute a component supply process of supplying a component and a loading head including a suction nozzle that executes a component suction process of sucking the component to obtain a component loading board by executing a component loading process of loading the component sucked by the suction nozzle on a board; and a management device connected to the mounting apparatus to allow data communication. The management device includes a management communication unit configured to acquire: suction position offset data indicating an offset amount of an suction position of the component with respect to the suction nozzle in the component suction process; loading position offset data indicating an offset amount of a loading position of the component with respect to the board in the component loading process; and various pieces of parameter information to identify each of the component, the feeder, the suction nozzle, and the loading head used in each process of the component supply process, the component suction process, and the component loading process. The management device further includes a management storage unit configured to accumulate and store management data in which the suction position offset data, the loading position offset data, and the various pieces of parameter information are associated with each other; a management display unit configured to display information on the management data; a management operation unit into which a command regarding a display mode of the management display unit is input; and a management control unit configured to control the management display unit in response to the command input into the management operation unit. The management control unit controls the management display unit such that, when a command to select one piece of parameter information from the various pieces of parameter information is input via the management operation unit, suction position offset distribution indicating distribution of a data group of the suction position offset data focusing on the one piece of parameter information, and loading position offset distribution indicating distribution of a data group of the loading position offset data are simultaneously displayed. Furthermore, the management control unit controls the management display unit such that, when a command to select one or more specific position offset data from the data group of one position offset distribution is input via the management operation unit, with the suction position offset distribution and the loading position offset distribution simultaneously displayed in the management display unit, attention data corresponding to the specific position offset data is displayed in a different display mode from a display mode of residual data in the data group of another position offset distribution.

The object, features, and advantages of the present disclosure will be more apparent from the following detailed description and the accompanying drawings.

BRIEF DESCRIPTION OF THE DRAWINGS

FIG. 9 is a view showing the display screen of the management display unit, showing a state in which the suction position offset distribution and the loading position offset distribution are displayed simultaneously;

DETAILED DESCRIPTION

A component mounting system according to an embodiment of the present disclosure will be described below with reference to the drawings.

Figure 1:
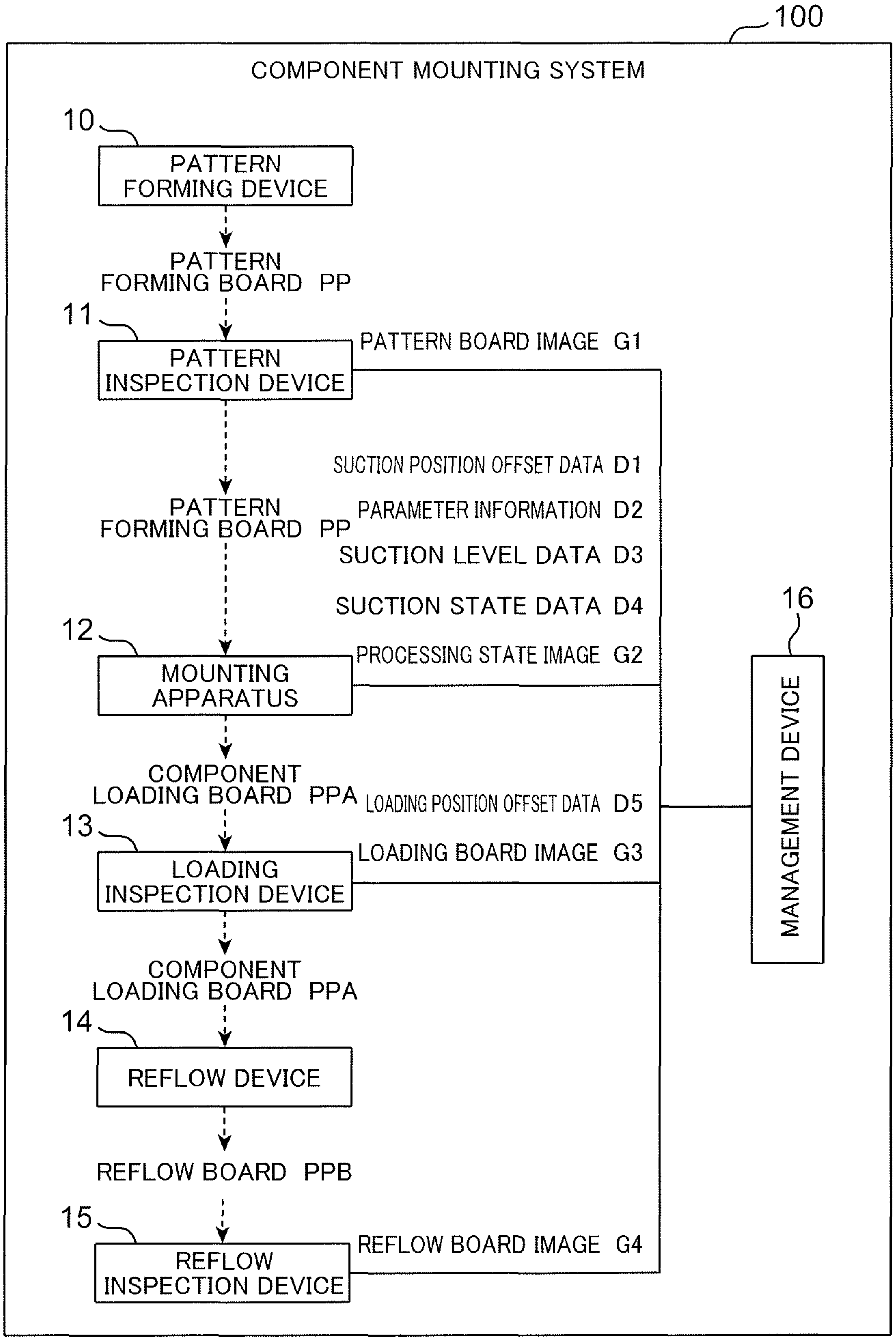
FIG. 1 is a diagram showing an overall configuration of a component mounting system according to one embodiment of the present disclosure.

As shown in FIG. 1, the component mounting system 100 according to the present embodiment includes a pattern forming device 10, a pattern inspection device 11, a mounting apparatus 12, a loading inspection device 13, a reflow device 14, a reflow inspection device 15, and a management device 16.

The pattern forming device 10, the pattern inspection device 11, the mounting apparatus 12, the loading inspection device 13, the reflow device 14, and the reflow inspection device 15 are coupled in a straight line in this order to form a component mounting line. The management device 16 is connected to the pattern inspection device 11, the mounting apparatus 12, the loading inspection device 13, and the reflow inspection device 15 to allow data communication.

The pattern forming device 10 is a device for obtaining a pattern forming board PP on which solder paste patterns are formed. The pattern forming board PP is brought into the pattern inspection device 11. The pattern inspection device 11 includes an image capturing unit that captures an image of the pattern forming board PP. The pattern inspection device 11 inspects the pattern forming board PP based on a pattern board image G1 indicating an image of the pattern forming board PP obtained by image capturing by the image capturing unit. The pattern board image G1 is an image including a region including a pixel group corresponding to the solder paste pattern on the pattern forming board PP. The pattern board image G1 is, for example, an image that allows checking a formation state of the solder paste pattern on the pattern forming board PP. The pattern inspection device 11 inspects the formation state of the solder paste pattern on the pattern forming board PP by executing predetermined image processing on the pattern board image G1. After inspection by the pattern inspection device 11, the pattern forming board PP is brought into the mounting apparatus 12.

The mounting apparatus 12 is an apparatus for producing a component loading board PPA with electronic components (hereinafter referred to as "component") loaded on the pattern forming board PP. The mounting apparatus 12 will be described with reference to FIGS. 2 to 4 in addition to FIG. 1. Note that FIG. 3 shows the orientation relationship by using XY orthogonal coordinates that are orthogonal to each other on the horizontal plane.

The mounting apparatus 12 includes a mounting apparatus body 2, a mounting control unit 4, a mounting communication unit 40, and a mounting storage unit 40M. The mounting apparatus body 2 constitutes a structural part that executes a component loading process for loading the component on the pattern forming board PP, and the like during production of the component loading board PPA. The mounting communication unit 40 is an interface for executing data communication with the management device 16, and has a function of outputting various data and information to the management device 16. The mounting control unit 4 controls the component loading process of the mounting apparatus body 2 and the like according to board data D25 stored in the mounting storage unit 40M and controls the data communication of the mounting communication unit 40.

The mounting apparatus body 2 includes a body frame 21, a conveyor 23, component supply units 24, a head unit 25, and a board support unit 28.

The body frame 21 is a structure on which respective parts that constitute the mounting apparatus body 2 are disposed, and is formed in a substantially rectangular shape in plan view when viewed from a direction orthogonal to both the X-axis direction and the Y-axis direction (perpendicular direction). The conveyor 23 extends in the X-axis direction and is disposed on the body frame 21. The conveyor 23 conveys the pattern forming board PP in the X-axis direction.

Positioning of the pattern forming board PP conveyed on the conveyor 23 is determined by the board support unit 28 at a predetermined work position (component loading position where a component is loaded on the pattern forming board PP). The board support unit 28 determines positioning of the pattern forming board PP on the conveyor 23 by supporting the pattern forming board PP from below.

The component supply units 24 are disposed in regions at both ends of the body frame 21 in the Y-axis direction, with the conveyor 23 interposed therebetween. Each of the component supply units 24 is a region installed in the body frame 21 with a plurality of feeders 24F installed in parallel, and the set position of each feeder 24F is divided for each component to be held by loading heads 251 provided in the head unit 25 to be described later. Each of the feeders 24F is detachably installed in the component supply unit 24. The feeder 24F is a device that executes a component supply process to supply the component. The feeder 24F is not particularly limited as long as the feeder can hold a plurality of components and supply the held components to predetermined component supply positions set in the feeder, and is, for example, a tape feeder. The tape feeder is a feeder including a reel on which a component storage tape that stores the component at predetermined intervals is wound, and configured to supply the component by feeding the component storage tape from the reel.

The head unit 25 is held by a moving frame 27. A fixed rail 261 extending in the Y-axis direction and a ball screw shaft 262 rotationally driven by a Y-axis servomotor 263 are disposed on the body frame 21. The moving frame 27 is disposed on the fixed rail 261, and a nut portion 271 provided in the moving frame 27 is screwed into the ball screw shaft 262. A guide member 272 extending in the X-axis direction and a ball screw shaft 273 driven by an X-axis servomotor 274 are disposed on the moving frame 27. The head unit 25 is movably held by the guide member 272, and the nut portion provided in the head unit 25 is screwed into the ball screw shaft 273. The moving frame 27 is moved by the operation of the Y-axis servomotor 263 in the Y-axis direction, and the head unit 25 is moved by the operation of the X-axis servomotor 274 in the X-axis direction with respect to the moving frame 27. That is, the head unit 25 is movable in the Y-axis direction as the moving frame 27 moves, and is movable in the X-axis direction along the moving frame 27. The head unit 25 is movable between the component supply unit 24 and the pattern forming board PP supported by the board support unit 28. The head unit 25 executes the component loading process for loading the component onto the pattern forming board PP by moving between the component supply unit 24 and the pattern forming board PP.

Figure 4:
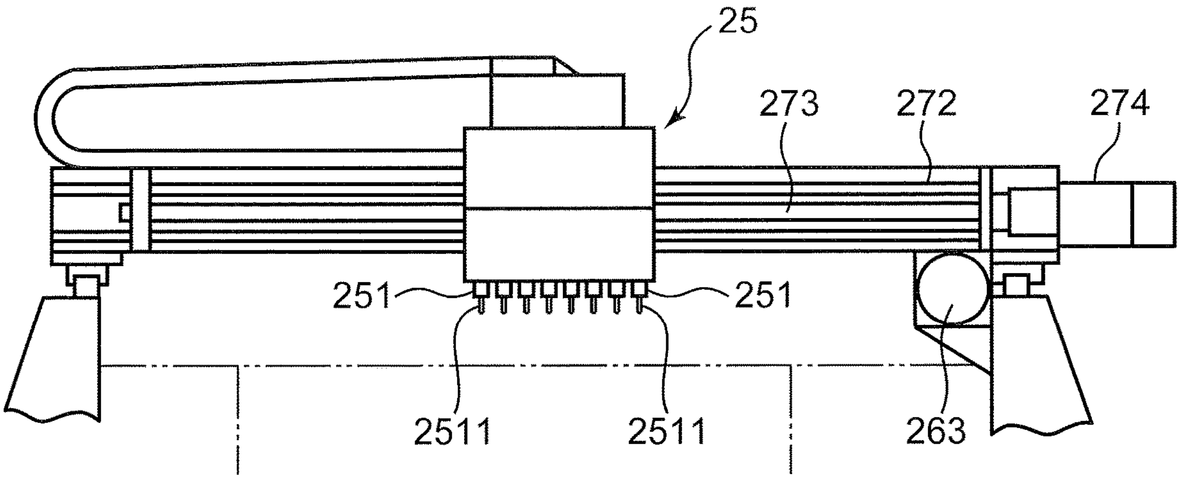
FIG. 4 is an enlarged view of a portion of a head unit of the mounting apparatus body.

As shown in FIG. 4, the head unit 25 includes the plurality of loading heads 251. Each loading head 251 includes an suction nozzle 2511 installed on the tip (lower end). The suction nozzle 2511 is a nozzle capable of sucking and holding the component supplied by the feeder 24F. The suction nozzle 2511 executes a component suction process for sucking the component. The suction nozzle 2511 can communicate with either of a negative pressure generation device, a positive pressure generation device, and the atmosphere via an electric switching valve. That is, the supply of negative pressure to the suction nozzle 2511 enables the suction and holding of the component by the suction nozzle 2511. After that, the supply of positive pressure releases the suction and holding of the component. Each loading head 251 executes the component loading process for loading the component sucked and held by the suction nozzle 2511 onto the pattern forming board PP at each of a plurality of target loading positions set on the pattern forming board PP. Each loading head 251 obtains the component loading board PPA by executing the component loading process on the pattern forming board PP.

Each loading head 251 can ascend and descend in the Z-axis direction (perpendicular direction) with respect to the frame of the head unit 25, and can rotate around the head axis extending in the Z-axis direction. Each loading head 251 can ascend and descend along the Z-axis direction between a suckable position where the suction nozzle 2511 can suck and hold the component and a retracted position above the suckable position. That is, when the suction nozzle 2511 sucks and holds the component, each loading head 251 descends from the retracted position toward the suckable position, and sucks and holds the component at the suckable position. Meanwhile, each loading head 251 after sucking and holding the component ascends from the suckable position toward the retracted position. Furthermore, each loading head 251 can ascend and descend along the Z-axis direction between a loadable position where the component sucked and held by the suction nozzle 2511 can be loaded at the predetermined target loading position on the pattern forming board PP, and the retracted position.

Figure 2:
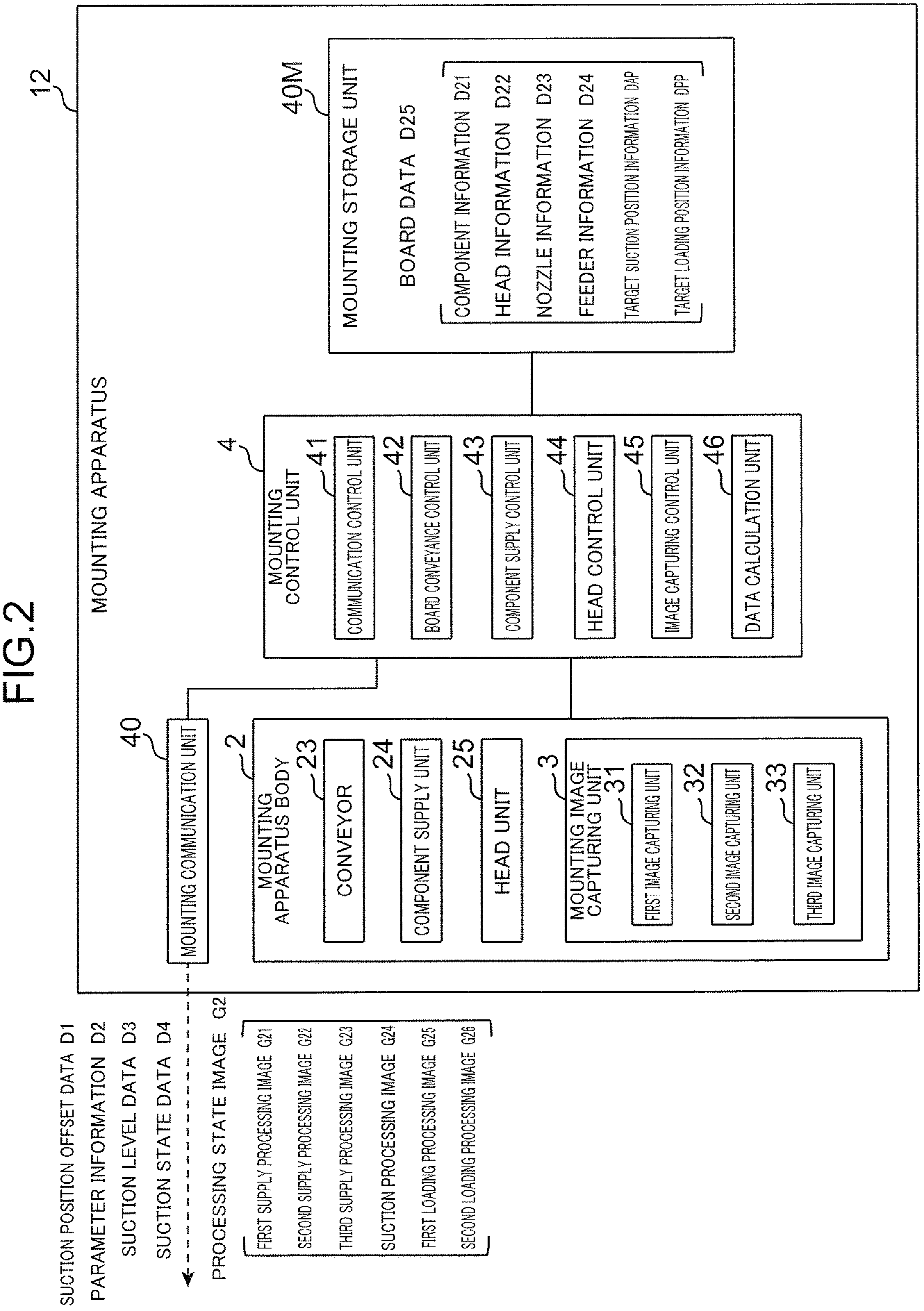
FIG. 2 is a block diagram of a mounting apparatus provided in the component mounting system.
Figure 3:
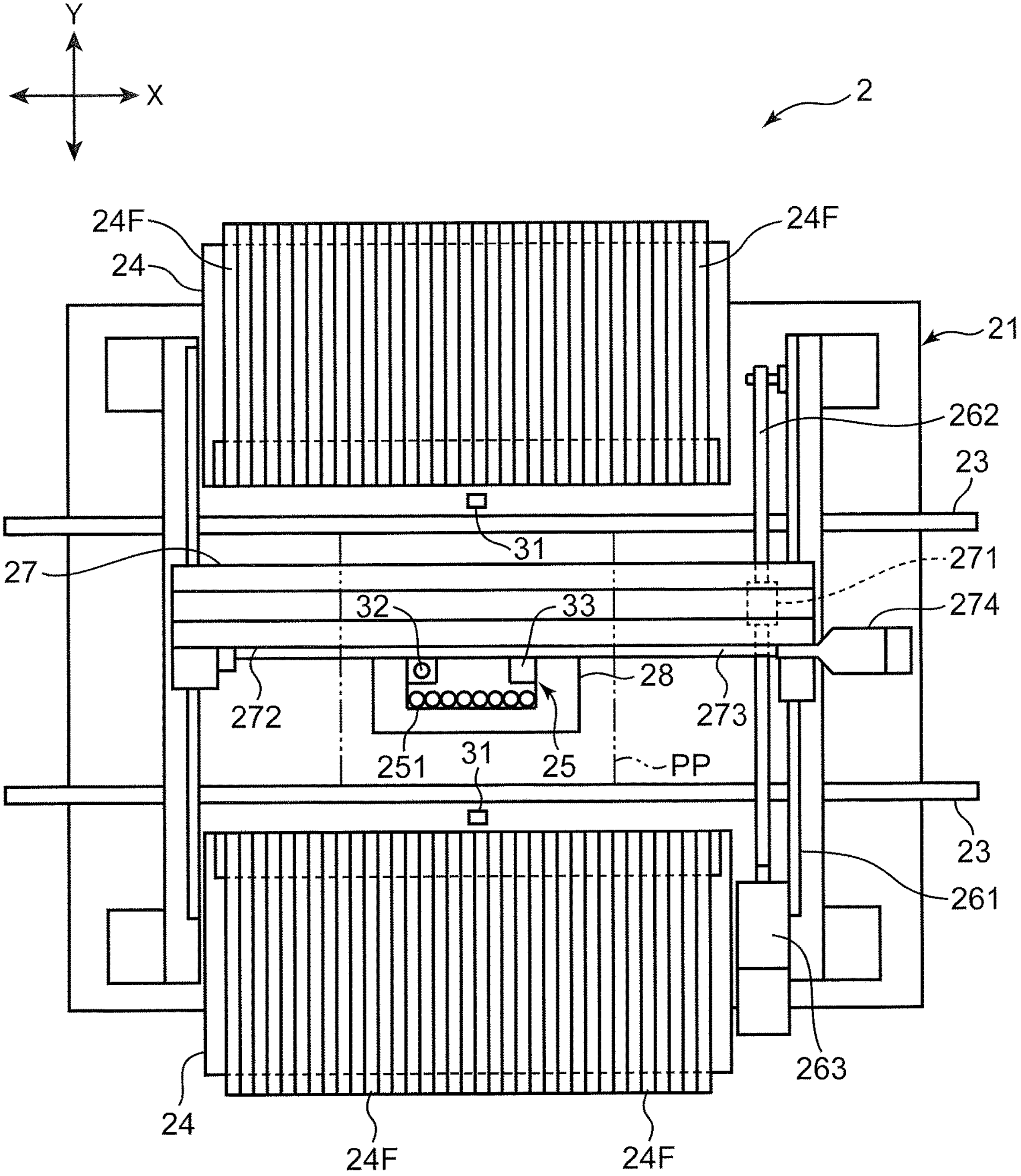
FIG. 3 is a plan view showing a configuration of a mounting apparatus body in the mounting apparatus.

As shown in FIGS. 2 and 3, the mounting apparatus body 2 further includes a mounting image capturing unit 3. The mounting image capturing unit 3 acquires a captured image by executing an image capturing operation of capturing an image of an object to be captured. The mounting image capturing unit 3 includes a first image capturing unit 31, a second image capturing unit 32, and a third image capturing unit 33.

The first image capturing unit 31 is, for example, an image capturing camera installed between the component supply unit 24 and the conveyor 23 on the body frame 21 or including an image capturing element such as a complementary metal-oxide-semiconductor (CMOS) and a charged-coupled device (CCD). When each loading head 251 is executing the component loading process, while the head unit 25 is moving from the component supply unit 24 to the pattern forming board PP supported by the board support unit 28, the first image capturing unit 31 captures an image of the component sucked and held by the suction nozzle 2511 of each loading head 251 from below to acquire an suction processing image G24.

The suction processing image G24 is an image including a region including a pixel group corresponding to an suction holding surface of the suction nozzle 2511 and a region including a pixel group corresponding to the component sucked to the suction nozzle 2511. Note that when the suction nozzle 2511 does not suck and hold the component, the suction processing image G24 is an image that includes only the region including the pixel group corresponding to the suction holding surface of the suction nozzle 2511 and does not include the region including the pixel group corresponding to the component. The suction processing image G24 is an image indicating the processing state of the component suction process by the suction nozzle 2511, and is included in a processing state image G2 acquired by the mounting apparatus 12. The suction processing image G24 is, for example, an image that enables checking of the posture of the component sucked to the suction nozzle 2511, the offset amount of the suction position of the component with respect to the suction nozzle 2511, and the like as the processing state of the component suction process. The suction processing image G24 is input into the mounting control unit 4 described later, and is referred to when a data calculation unit 46 calculates a suction position offset. The suction processing image G24 is sent to the management device 16 via the mounting communication unit 40.

The second image capturing unit 32 is, for example, an image capturing camera disposed in the head unit 25 and including a CMOS or CCD image capturing element or the like. The second image capturing unit 32 captures an image of the component supply position of the feeder 24F from diagonally above, with the head unit 25 disposed such that the suction nozzle 2511 is positioned directly above the component supply position set in the feeder 24F. Specifically, before the suction nozzle 2511 executes the suction operation, the second image capturing unit 32 acquires a first supply processing image G21 by capturing an image of the component supplied to the component supply position by the feeder 24F from diagonally above. Furthermore, the second image capturing unit 32 captures the state of the component supply position while the suction nozzle 2511 is executing the suction operation on the component supplied to the component supply position by the feeder 24F to acquire a second supply processing image G22. The second image capturing unit 32 captures the state of the component supply position after the suction nozzle 2511 finishes the suction operation to acquire a third supply processing image G23.

The first supply processing image G21 is an image including a region including a pixel group corresponding to the component supply position of the feeder 24F and a region including a pixel group corresponding to the component supplied to the component supply position. The second supply processing image G22 is an image including the region including the pixel group corresponding to the component supply position of the feeder 24F, the region including the pixel group corresponding to the component supplied to the component supply position, and a region including a pixel group corresponding to the suction nozzle 2511. The third supply processing image G23 is an image including the region including the pixel group corresponding to the component supply position of the feeder 24F after the suction nozzle 2511 finishes the suction operation. The first supply processing image G21, the second supply processing image G22, and the third supply processing image G23 are images indicating the processing state of the component supply process by the feeder 24F and are included in the processing state image G2 acquired by the mounting apparatus 12. The first supply processing image G21, the second supply processing image G22, and the third supply processing image G23 are, for example, images that enable checking of the posture of the component supplied to the component supply position of the feeder 24F, suction performance of the component by the suction nozzle 2511 at the component supply position, and the like as the processing state of the component supply process. The first supply processing image G21, the second supply processing image G22, and the third supply processing image G23 are sent to the management device 16 via the mounting communication unit 40.

The second image capturing unit 32 captures an image of the target loading position from diagonally above with the head unit 25 disposed such that the suction nozzle 2511 that sucks and holds the component is positioned directly above the target loading position set on the pattern forming board PP. Specifically, before the loading head 251 loads the component sucked by the suction nozzle 2511 onto the pattern forming board PP, the second image capturing unit 32 captures an image of the target loading position on the pattern forming board PP from diagonally above to acquire a first loading processing image G25. Furthermore, the second image capturing unit 32 captures an image of the state of the target loading position after the loading head 251 finishes the component loading operation to acquire a second loading processing image G26.

The first loading processing image G25 is an image including a region including a pixel group corresponding to the target loading position on the pattern forming board PP and a region including a pixel group corresponding to the surroundings of the target loading position. The second loading processing image G26 is an image including a region including a pixel group corresponding to the target loading position after the loading head 251 finishes the component loading operation. The first loading processing image G25 and the second loading processing image G26 are images indicating the processing state of the component loading process by the loading head 251, and are included in the processing state image G2 acquired by the mounting apparatus 12. The first loading processing image G25 and the second loading processing image G26 are, for example, images that enable checking of the posture of the component loaded at the target loading position on the pattern forming board PP as the processing state of the component loading process. The first loading processing image G25 and the second loading processing image G26 are sent to the management device 16 via the mounting communication unit 40.

The third image capturing unit 33 is, for example, an image capturing camera disposed in the head unit 25 and including a CMOS or CCD image capturing element or the like. To recognize various marks affixed to an upper surface of the pattern forming board PP supported by the board support unit 28 while each loading head 251 is executing the component loading process, the third image capturing unit 33 captures an image of the marks from above. By recognizing the marks on the pattern forming board PP by the third image capturing unit 33, the position offset amount with respect to origin coordinates of the pattern forming board PP is detected.

The mounting storage unit 40M stores the board data D25 to be referred to by the mounting control unit 4. The board data D25 is data including a plurality of pieces of parameter information D2 required to control the component loading process of the mounting apparatus body 2 and the like by the mounting control unit 4, target suction position information DAP, and target loading position information DPP. The parameter information D2 includes component information D21, head information D22, nozzle information D23, and feeder information D24.

As parameters to identify the type of component, the component name indicating the type of component, the external dimensions of the component in the X-axis direction and the Y-axis direction, the thickness of the component, and the like are registered in the component information D21. The head information D22 is information in which parameters for identifying the type of the loading head 251 are registered. As the parameters for identifying the type of the loading head 251, the number of the loading head 251 and the like are registered in the head information D22. The nozzle information D23 is information in which parameters for identifying the type of the suction nozzle 2511 are registered. As the parameters for identifying the type of the suction nozzle 2511, the type of the suction nozzle 2511, an identifier of the suction nozzle 2511, and the like are registered in the nozzle information D23. The feeder information D24 is information in which parameters for identifying the type of the feeder 24F are registered. As the parameters for identifying the type of the feeder 24F, the type of the feeder 24F, the set position of the feeder 24F in the component supply unit 24, and the like are registered in the feeder information D24.

The target suction position information DAP is information in which the target suction position (target suction position) when the suction nozzle 2511 attaches the component is registered as a parameter. Coordinates of the target suction position of the component with respect to the suction nozzle 2511 in each of the X-axis direction and the Y-axis direction are registered as a parameter in the target suction position information DAP. The target suction position is usually set at the central position on the sucked surface of the component. The target loading position information DPP is information in which the target loading position of the component set in the pattern forming board PP is registered as a parameter. Coordinates of the target loading position on the pattern forming board PP in each of the X-axis direction and the Y-axis direction are registered as a parameter in the target loading position information DPP.

The mounting control unit 4 includes a central processing unit (CPU), a read only memory (ROM) that stores a control program, a random access memory (RAM) used as a work area for the CPU, and the like. The mounting control unit 4 controls the operation of each constituent element of the mounting apparatus body 2 by executing the control program stored in the ROM by the CPU, controls the data communication operation of the mounting communication unit 40, and further executes various kinds of arithmetic processing. The mounting control unit 4 controls the operation of each constituent element of the mounting apparatus body 2 according to the board data D25 stored in the mounting storage unit 40M. As shown in FIG. 2, the mounting control unit 4 includes, as main functional configurations, a communication control unit 41, a board conveyance control unit 42, a component supply control unit 43, a head control unit 44, an image capturing control unit 45, and the data calculation unit 46.

The communication control unit 41 controls data communication between the mounting apparatus 12 and the management device 16 by controlling the mounting communication unit 40. The mounting communication unit 40 controlled by the communication control unit 41 sends, to the management device 16: suction position offset data D1, suction level data D3, and suction state data D4 acquired by the data calculation unit 46 described later; the parameter information D2 included in the board data D25 stored in the mounting storage unit 40M; and the processing state image G2 acquired by the first image capturing unit 31 and the second image capturing unit 32. Note that the parameter information D2 sent to the management device 16 via the mounting communication unit 40 includes the component information D21, the head information D22, the nozzle information D23, and the feeder information D24. The processing state image G2 sent to the management device 16 via the mounting communication unit 40 includes the first supply processing image G21, the second supply processing image G22, the third supply processing image G23, the suction processing image G24, the first loading processing image G25, and the second loading processing image G26.

While details will be described later, the suction position offset data D1, the suction level data D3, and the suction state data D4 are data acquired by the data calculation unit 46 for each component loading process by the loading head 251. During one execution of the component loading process by the loading head 251, one type of component is used from a plurality of types of component, one loading head 251 from the plurality of loading heads 251 is used, one suction nozzle 2511 from the plurality of suction nozzles 2511 is used, and one feeder 24F from the plurality of feeders 24F is used. That is, for each component loading process by the loading head 251, the component, the loading head 251, the suction nozzle 2511, and the feeder 24F to be used are uniquely determined. Furthermore, for each component loading process by the loading head 251, each processing state image G2 is acquired by the first image capturing unit 31 and the second image capturing unit 32. Therefore, the suction position offset data D1, the suction level data D3, and the suction state data D4 acquired by the data calculation unit 46 for each component loading process by the loading head 251, various pieces of parameter information D2, and various processing state images G2 are associated with each other.

The board conveyance control unit 42 controls the conveyance operation of the pattern forming board PP by the conveyor 23. The component supply control unit 43 controls the component supply process of each of the plurality of feeders 24F arranged in the component supply unit 24 according to the component information D21 and the feeder information D24 in the board data D25. The head control unit 44 controls the loading head 251 by controlling the head unit 25 according to the component information D21, the head information D22, the nozzle information D23, the target suction position information DAP, and the target loading position information DPP in the board data D25. Accordingly, the head control unit 44 causes the loading head 251 to execute the component loading process for loading the component sucked and held by the suction nozzle 2511 onto the pattern forming board PP at each of the plurality of target loading positions set on the pattern forming board PP. The image capturing control unit 45 controls the image capturing operation by the first image capturing unit 31, the second image capturing unit 32, and the third image capturing unit 33 that constitute the mounting image capturing unit 3.

The data calculation unit 46 recognizes the actual suction position of the component by the suction nozzle 2511 based on the suction processing image G24 acquired by the first image capturing unit 31, and calculates the position offset of the recognized actual suction position with respect to the target suction position indicated by the target suction position information DAP. Then, the data calculation unit 46 acquires the suction position offset data D1 indicating the position offset amount between the actual suction position and the target suction position for each component loading process by the loading head 251. The suction position offset data D1 acquired by the data calculation unit 46 is data indicating the offset amount of the suction position of the component with respect to the suction nozzle 2511 in the component suction process.

The data calculation unit 46 acquires data on the negative pressure level of the negative pressure generation device connected to the suction nozzle 2511 as the suction level data D3 indicating the suction level of the component by the suction nozzle 2511 in the component suction process. At this time, the data calculation unit 46 acquires the suction level data D3 for each component loading process by the loading head 251.

The data calculation unit 46 acquires the suction state data D4 indicating whether the suction state of the component by the suction nozzle 2511 in the component suction process is normal for each component loading process by the loading head 251 based on the negative pressure level data of the negative pressure generation device connected to the suction nozzle 2511. When the negative pressure level of the negative pressure generation device is within the allowable range while the processing of the component suction process is executed by the suction nozzle 2511, the data calculation unit 46 acquires the suction state data D4 to which suction normal information indicating that the suction state of the component by the suction nozzle 2511 is normal is added. Meanwhile, when the negative pressure level of the negative pressure generation device is outside the allowable range, the data calculation unit 46 acquires the suction state data D4 to which suction abnormal information indicating that the suction state of the component by the suction nozzle 2511 is abnormal is added.

Each suction position offset data D1, each suction level data D3, and each suction state data D4 for each component loading process acquired by the data calculation unit 46 are sent to the management device 16 via the mounting communication unit 40 in association with various pieces of parameter information D2 and various processing state images G2.

Figure 5:
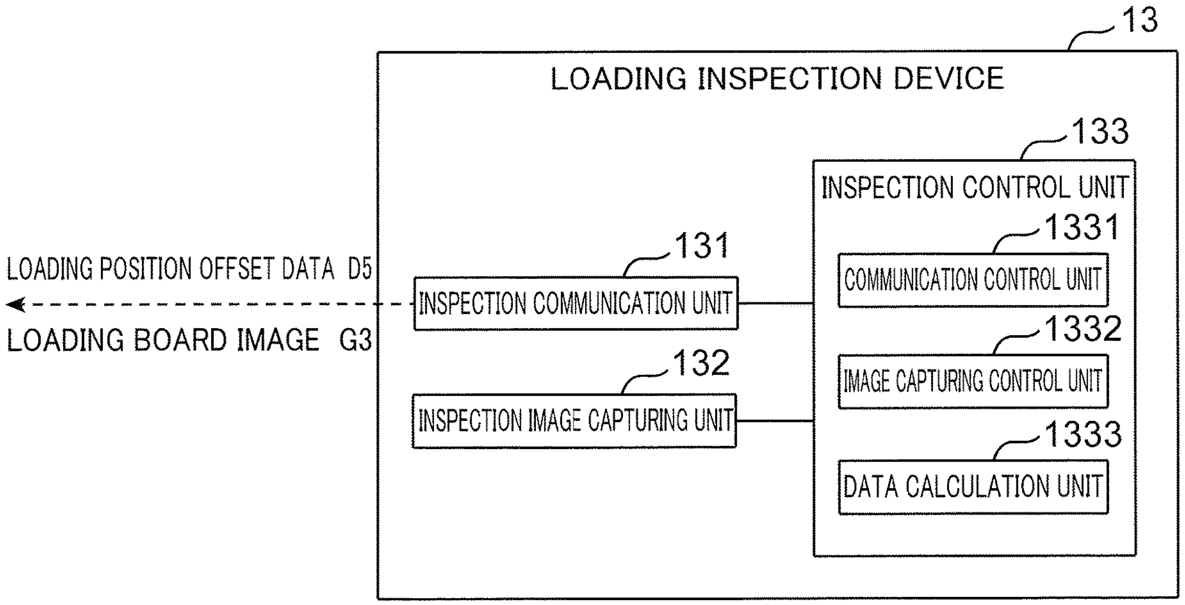
FIG. 5 is a block diagram of a loading inspection device provided in the component mounting system.

Returning to FIG. 1, the component loading board PPA obtained by the component loading process of the loading head 251 is brought into the loading inspection device 13. The loading inspection device 13 is a device for inspecting the component loading board PPA based on a loading board image G3 indicating an image of the component loading board PPA. The loading inspection device 13 will be described with reference to FIG. 5 in addition to FIG. 1. The loading inspection device 13 includes an inspection communication unit 131, an inspection image capturing unit 132, and an inspection control unit 133.

The inspection communication unit 131 is an interface for executing data communication with the management device 16, and has a function of outputting various data and information to the management device 16. The inspection communication unit 131 sends, to the management device 16, loading position offset data D5 acquired by a data calculation unit 1333 described later and the loading board image G3 acquired by the inspection image capturing unit 132.

The inspection image capturing unit 132 is, for example, an image capturing camera including a CMOS or CCD image capturing element or the like. The inspection image capturing unit 132 acquires the loading board image G3 by capturing from above an image of the component loading board PPA conveyed from the mounting apparatus 12. The loading board image G3 is an image including a region including a pixel group corresponding to the component on the component loading board PPA. The loading board image G3 is, for example, an image that enables checking of the posture of the component on the component loading board PPA after being conveyed from the mounting apparatus 12, the offset amount of the component loading position, and the like.

The inspection control unit 133 includes a CPU, a ROM that stores the control program, a RAM used as a work area for the CPU, and the like. The inspection control unit 133 controls the inspection communication unit 131 and the inspection image capturing unit 132, and executes various arithmetic processes by the CPU executing the control program stored in the ROM. The inspection control unit 133 includes a communication control unit 1331, an image capturing control unit 1332, and the data calculation unit 1333 as main functional configurations.

The communication control unit 1331 controls data communication between the loading inspection device 13 and the management device 16 by controlling the inspection communication unit 131. The image capturing control unit 1332 controls the image capturing operation by the inspection image capturing unit 132.

The data calculation unit 1333 recognizes the actual loading positions (actual loading position) of the plurality of components on the component loading board PPA based on the loading board image G3 acquired by the inspection image capturing unit 132, and calculates the position offset between the plurality of recognized actual loading positions and the plurality of target loading positions indicated by the target loading position information DPP. Then, the data calculation unit 1333 acquires the loading position offset data D5 indicating the position offset amount between the actual loading position and the target loading position at each of the plurality of target loading positions set on the pattern forming board PP. The loading position offset data D5 acquired by the data calculation unit 1333 is data indicating the offset amount of the component loading position on the pattern forming board PP in the component loading process by the loading head 251.

The loading position offset data D5 acquired by the data calculation unit 1333 is sent to the management device 16 via the inspection communication unit 131 in association with the loading board image G3 acquired by the inspection image capturing unit 132.

Returning to FIG. 1, the component loading board PPA after inspection by the loading inspection device 13 is brought into the reflow device 14. The reflow device 14 is a device for obtaining a reflow board PPB by executing a reflow process for melting and then hardening solder on the component loading board PPA.

The reflow board PPB obtained by the reflow device 14 is brought into the reflow inspection device 15. The reflow inspection device 15 includes an image capturing unit that captures an image of the reflow board PPB. The reflow inspection device 15 inspects the reflow board PPB based on a reflow board image G4 indicating an image of the reflow board PPB obtained by image capturing by the image capturing unit. The reflow board image G4 is an image including a region including a pixel group corresponding to the component on the reflow board PPB. The reflow board image G4 is, for example, an image that enables checking of the posture of the component on the reflow board PPB after the reflow process. The reflow inspection device 15 inspects the state of the component on the reflow board PPB and the like by executing predetermined image processing on the reflow board image G4.

The management device 16 is connected to the pattern inspection device 11, the mounting apparatus 12, the loading inspection device 13, and the reflow inspection device 15 to allow data communication, and includes, for example, a microcomputer. The pattern board image G1 from the pattern inspection device 11 is input into the management device 16, and the suction position offset data D1, the parameter information D2, the suction level data D3, the suction state data D4, and the processing state image G2 from the mounting apparatus 12 are input. The loading position offset data D5 and the loading board image G3 from the loading inspection device 13 are input into the management device 16, and the reflow board image G4 from the reflow inspection device 15 is input. The management device 16 is operated by an operator.

Figure 6:
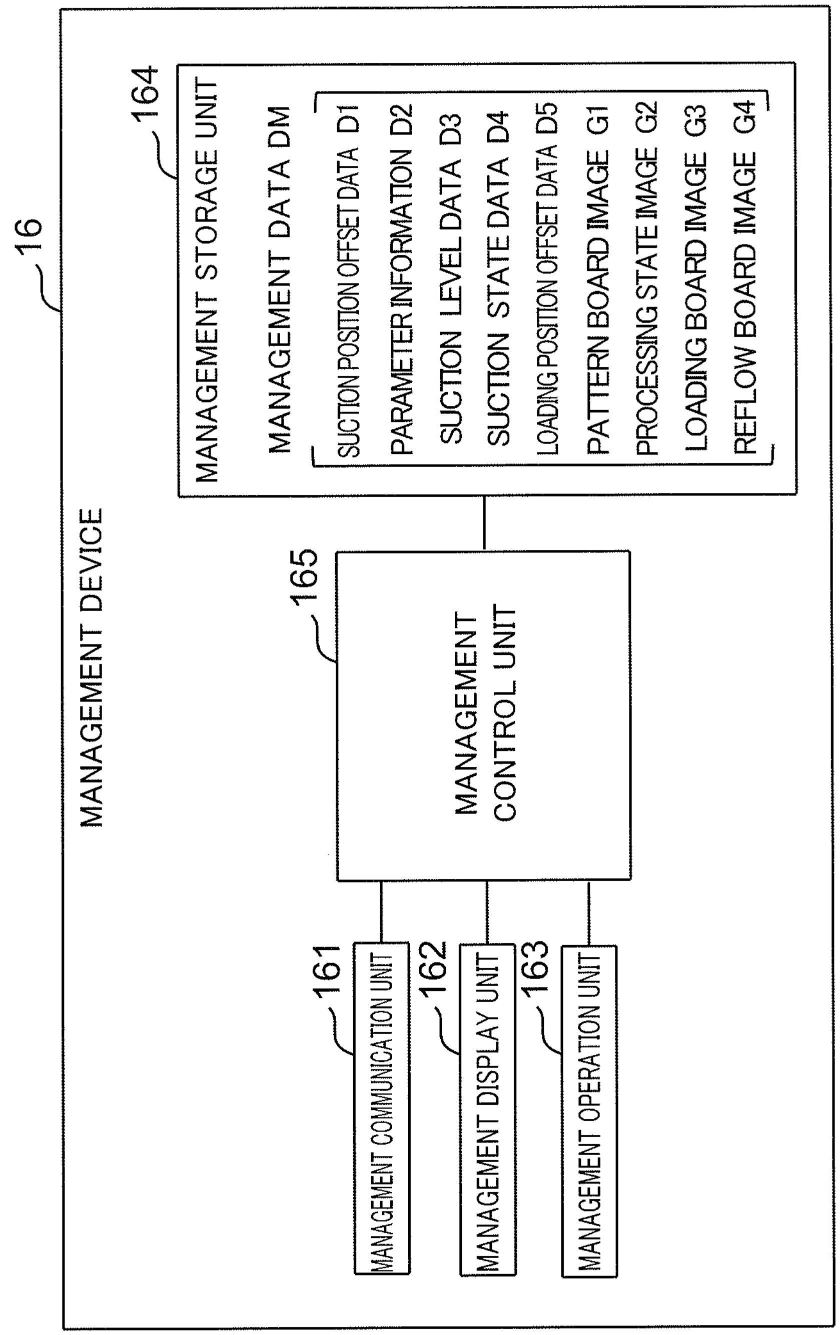
FIG. 6 is a block diagram of a management device provided in the component mounting system.

A configuration of the management device 16 will be described with reference to the block diagram of FIG. 6. The management device 16 includes a management communication unit 161, a management display unit 162, a management operation unit 163, a management storage unit 164, and a management control unit 165.

The management communication unit 161 is an interface for making data communication with the pattern inspection device 11, the mounting apparatus 12, the loading inspection device 13, and the reflow inspection device 15. The management communication unit 161 acquires the pattern board image G1 from the pattern inspection device 11, and acquires the suction position offset data D1, the parameter information D2, the suction level data D3, the suction state data D4, and the processing state image G2 from the mounting apparatus 12. Furthermore, the management communication unit 161 acquires the loading position offset data D5 and the loading board image G3 from the loading inspection device 13, and acquires the reflow board image G4 from the reflow inspection device 15.

The management storage unit 164 accumulates and stores various data, information, and images acquired by the management communication unit 161. The management storage unit 164 accumulates and stores management data DM in which the suction position offset data D1, the parameter information D2, the suction level data D3, the suction state data D4, the loading position offset data D5, the pattern board image G1, the processing state image G2, the loading board image G3, and the reflow board image G4 are associated with each other.

The management display unit 162 includes, for example, a liquid crystal display and the like. The management display unit 162 displays information on the management data DM stored in the management storage unit 164. The display operation of the management display unit 162 is controlled by the management control unit 165.

The management operation unit 163 includes a keyboard, a mouse, a touch panel, or the like provided in the management display unit 162. The management operation unit 163 receives input operations of various commands regarding the display mode of the management display unit 162 by the operator.

The management control unit 165 controls the management display unit 162 according to the command input into the management operation unit 163.

Figure 7:
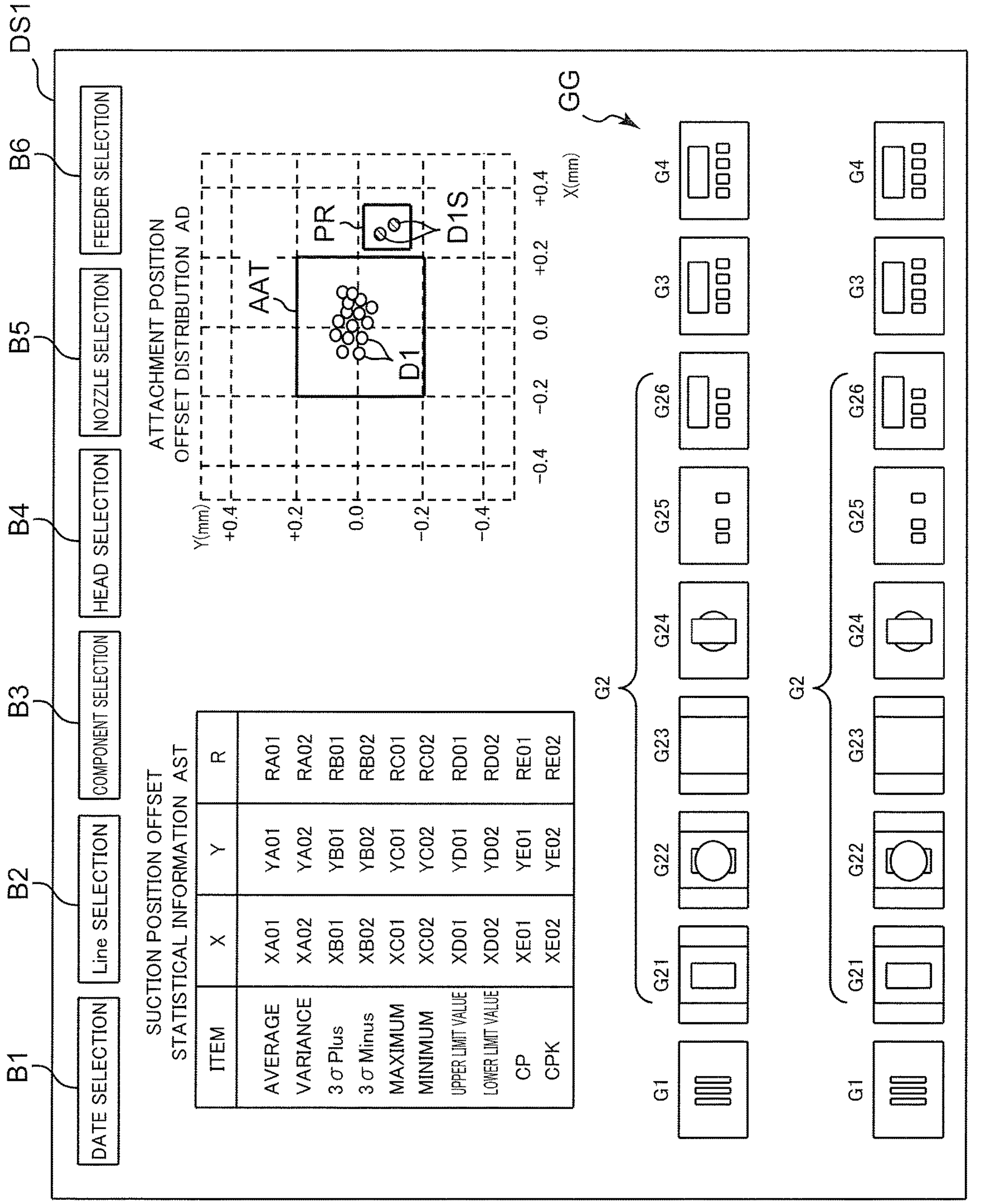
FIG. 7 is a view showing a display screen of a management display unit provided in the management device, showing a state in which suction position offset distribution is displayed.

When an suction offset display command to display a position offset status of the component suction position with respect to the suction nozzle 2511 is input via the management operation unit 163, the management control unit 165 causes the management display unit 162 to display a display screen DS1 as shown in FIG. 7. Specifically, based on each management data DM accumulated and stored in the management storage unit 164, the management control unit 165 causes the display screen DS1 of the management display unit 162 to display suction position offset distribution AD indicating distribution of the data group including each suction position offset data D1 included in each management data DM. The suction position offset distribution AD is represented by, for example, an "XY offset distribution" indicating distribution of the position offset in the X and Y coordinates about the position offset amount of the actual component suction position with respect to the target suction position for the suction nozzle 2511 indicated by each suction position offset data D1.

The operator can visually check the generating status of the position offset of the actual component suction position by the suction nozzle 2511 based on the suction position offset distribution AD displayed in the management display unit 162.

At this time, the management control unit 165 may control the management display unit 162 such that suction position offset statistical information AST indicating statistics of the data group including each suction position offset data D1 is displayed simultaneously with the suction position offset distribution AD. The suction position offset statistical information AST includes information such as the average of position offset amount, variance and standard deviation ($3\sigma$) that are indicators of the magnitude of data dispersion, the maximum and minimum position offset amounts, and the like for the data group including each suction position offset data D1. Such suction position offset statistical information AST may be associated with information such as the upper and lower limits of the allowable range of the suction position offset amount, and CP and CPK, which are process capability indexes.

The management control unit 165 controls the management display unit 162 such that a date selection region B1, a Line selection region B2, a component selection region B3, a head selection region B4, a nozzle selection region B5, and a feeder selection region B6 that allow input operations via the management operation unit 163 are set on the display screen DS1.

The operator can select the acquisition date or acquisition period by the data calculation unit 46 of the mounting control unit 4 for each suction position offset data D1 that constitutes the suction position offset distribution AD by operating the date selection region B1 by using the management operation unit 163. For example, when a predetermined date or period is selected by an input operation on the date selection region B1, the management control unit 165 causes the management display unit 162 to display the suction position offset distribution AD indicating distribution of the data group including each suction position offset data D1 acquired by the data calculation unit 46 of the mounting control unit 4 on the predetermined date or predetermined period.

The operator can select the mounting apparatus 12 that is the output source of each suction position offset data D1 that constitutes the suction position offset distribution AD, and the like by using the management operation unit 163 to operate the Line selection region B2. For example, when the predetermined mounting apparatus 12 is selected by an input operation into the Line selection region B2, the management control unit 165 causes the management display unit 162 to display the suction position offset distribution AD indicating distribution of the data group including each suction position offset data D1 output from the mounting communication unit 40 of the predetermined mounting apparatus 12.

The component selection region B3, the head selection region B4, the nozzle selection region B5, and the feeder selection region B6 that are set on the display screen DS1 are regions to input a command to select one piece of parameter information from the component information D21, the head information D22, the nozzle information D23, and the feeder information D24 that constitute the parameter information D2 associated with the suction position offset data D1. The operator can input a command to select the component information D21 from the parameter information D2 by using the management operation unit 163 to operate the component selection region B3. Similarly, the operator can input a command to select the head information D22 from the parameter information D2 by using the management operation unit 163 to operate the head selection region B4. The operator can input a command to select the nozzle information D23 from the parameter information D2 by using the management operation unit 163 to operate the nozzle selection region B5. The operator can input a command to select the feeder information D24 from the parameter information D2 by using the management operation unit 163 to operate the feeder selection region B6.

The management control unit 165 causes the management display unit 162 to display the suction position offset distribution AD focusing on one piece of information selected from the parameter information D2 to be switchable as the parameter selection changes. Specifically, the management control unit 165 controls the management display unit 162 such that, when a command to select the component information D21 from the parameter information D2 is input via the management operation unit 163, the suction position offset distribution AD focusing on the component identified by the component information D21 is displayed. Similarly, the management control unit 165 controls the management display unit 162 such that, when a command to select the head information D22 from the parameter information D2 is input via the management operation unit 163, the suction position offset distribution AD focusing on the loading head 251 identified by the head information D22 is displayed. The management control unit 165 controls the management display unit 162 such that, when a command to select the nozzle information D23 from the parameter information D2 is input via the management operation unit 163, the suction position offset distribution AD focusing on the suction nozzle 2511 identified by the nozzle information D23 is displayed. The management control unit 165 controls the management display unit 162 such that, when a command to select the feeder information D24 from the parameter information D2 is input via the management operation unit 163, the suction position offset distribution AD focusing on the feeder 24F identified by the feeder information D24 is displayed.

Here, the component, the loading head 251, the suction nozzle 2511, and the feeder 24F that are respectively identified by the component information D21, the head information D22, the nozzle information D23, and the feeder information D24 that constitute the parameter information D2 associated with the suction position offset data D1 of the suction position offset distribution AD can be a generating factor for the component suction position offset by the suction nozzle 2511. That is, the posture and shape of the component supplied by the feeder 24F affect the suction and holding performance of the component by the suction nozzle 2511. The operating characteristics and the status of aged deterioration of the suction nozzle 2511 and the loading head 251 also affect the suction and holding performance of the component by the suction nozzle 2511.

Therefore, the management display unit 162 displays the suction position offset distribution AD focusing on one piece of information selected from the parameter information D2 via the management operation unit 163 based on the control of the management display unit 162 by the management control unit 165. This allows the operator to identify the generating factor for the suction position offset while visually checking the generating status of component suction position offset by the suction nozzle 2511.

Assume a case where the suction position offset data D1 exists that exceeds an suction offset allowable range AAT indicating the allowable range of the offset amount of the suction position of the component with respect to the suction nozzle 2511 in the suction position offset distribution AD. In this case, the management control unit 165 may control the management display unit 162 such that the suction position offset data D1 exceeding the suction offset allowable range AAT is displayed in a different display mode from the display mode of other position offset data. For example, the management control unit 165 controls the management display unit 162 such that the display color of the plot of the suction position offset data D1 exceeding the suction offset allowable range AAT is different from the display color of other position offset data.

As shown in FIG. 7, assume a case where a command to select one or more specific position offset data D1S from the data group of the suction position offset data D1 constituting the suction position offset distribution AD is input via the management operation unit 163, with the suction position offset distribution AD displayed in the management display unit 162. In this case, the management control unit 165 controls the management display unit 162 such that an image group GG including the first supply processing image G21, the second supply processing image G22, the third supply processing image G23, the suction processing image G24, the first loading processing image G25, and the second loading processing image G26 that constitute the processing state image G2 corresponding to the specific position offset data D1S is displayed simultaneously with the suction position offset distribution AD. FIG. 7 shows an example where two specific position offset data D1S included in a predetermined selection region PR from the data group of the suction position offset data D1 that constitutes the suction position offset distribution AD are selected. In this case, the management control unit 165 controls the management display unit 162 such that two pairs of image groups GG corresponding to the two specific position offset data D1S are displayed simultaneously with the suction position offset distribution AD.

Each image that constitutes the processing state image G2 is an image associated with the suction position offset data D1, and is an image indicating the processing state of each process of the component supply process of the feeder 24F, the component suction process of the suction nozzle 2511, and the component loading process of the loading head 251. The operator can accurately determine the influence of the processes of the component supply process, the component suction process, and the component loading process on the suction position offset by checking each image that constitutes the processing state image G2 displayed simultaneously with the suction position offset distribution AD in the management display unit 162 in response to the selection command of the specific position offset data D1S via the management operation unit 163. This allows the operator to more accurately identify the generating factor for the suction position offset. After identifying the generating factor for the suction position offset, the operator can take appropriate measures against the generating factor, and can thereby solve the defect of the position offset of the component loading position on the pattern forming board PP caused by the suction position offset.

When the component is identified as the generating factor for the suction position offset, for example, the operator checks input values of parameters such as external dimensions of the component registered in the component information D21 of the board data D25. When the parameter of the component information D21 is input incorrectly or the like, as a countermeasure for the generating factor for the suction position offset, the operator executes data change work to change the data of the component information D21.

When the loading head 251 is identified as the generating factor for the suction position offset, for example, the operator confirms whether the suckable position set as a descending position of the loading head 251 is appropriate when the suction nozzle 2511 attaches the component. Then, when the suckable position set for the loading head 251 is not appropriate, the operator executes work to adjust the attachable position set for the loading head 251 as a countermeasure for the generating factor for the suction position offset. When the loading head 251 is found to have aged deterioration, the operator executes work to replace the loading head 251 or the like.

When the suction nozzle 2511 is identified as the generating factor for the suction position offset, for example, the operator executes work to clean or replace the suction nozzle 2511 or the like as a countermeasure for the generating factor for the suction position offset.

When the feeder 24F is identified as the generating factor for the suction position offset, for example, the operator executes work to replace the feeder 24F or the like as a countermeasure for the generating factor for the suction position offset.

In the present embodiment, when a command to select the specific position offset data D1S is input via the management operation unit 163, the management control unit 165 controls the management display unit 162 such that the image group GG including the loading board image G3 in addition to various images that constitute the processing state image G2 is displayed simultaneously with the suction position offset distribution AD. By checking the processing state image G2 and the loading board image G3 displayed simultaneously with the suction position offset distribution AD in the management display unit 162, the operator can confirm whether the position offset of the component suction position by the suction nozzle 2511 affects the position offset of the component loading position on the pattern forming board PP. By comparing each image that constitutes the processing state image G2 with the loading board image G3, the operator can also confirm whether the component position offset has occurred while the component loading board PPA is conveyed from the mounting apparatus 12 to the loading inspection device 13.

Furthermore, in the present embodiment, when a command to select the specific position offset data D1S is input via the management operation unit 163, the management control unit 165 controls the management display unit 162 such that the image group GG including the pattern board image G1 and the reflow board image G4 in addition to the processing state image G2 and the loading board image G3 is displayed simultaneously with the suction position offset distribution AD. By checking the pattern board image G1 displayed simultaneously with the suction position offset distribution AD in the management display unit 162, the operator can confirm the influence of the formation status of the solder paste pattern on the suction position offset. By checking the reflow board image G4 displayed simultaneously with the suction position offset distribution AD in the management display unit 162, the operator can confirm the position offset status of the component on the reflow board PPB after the reflow process.

Figure 8:
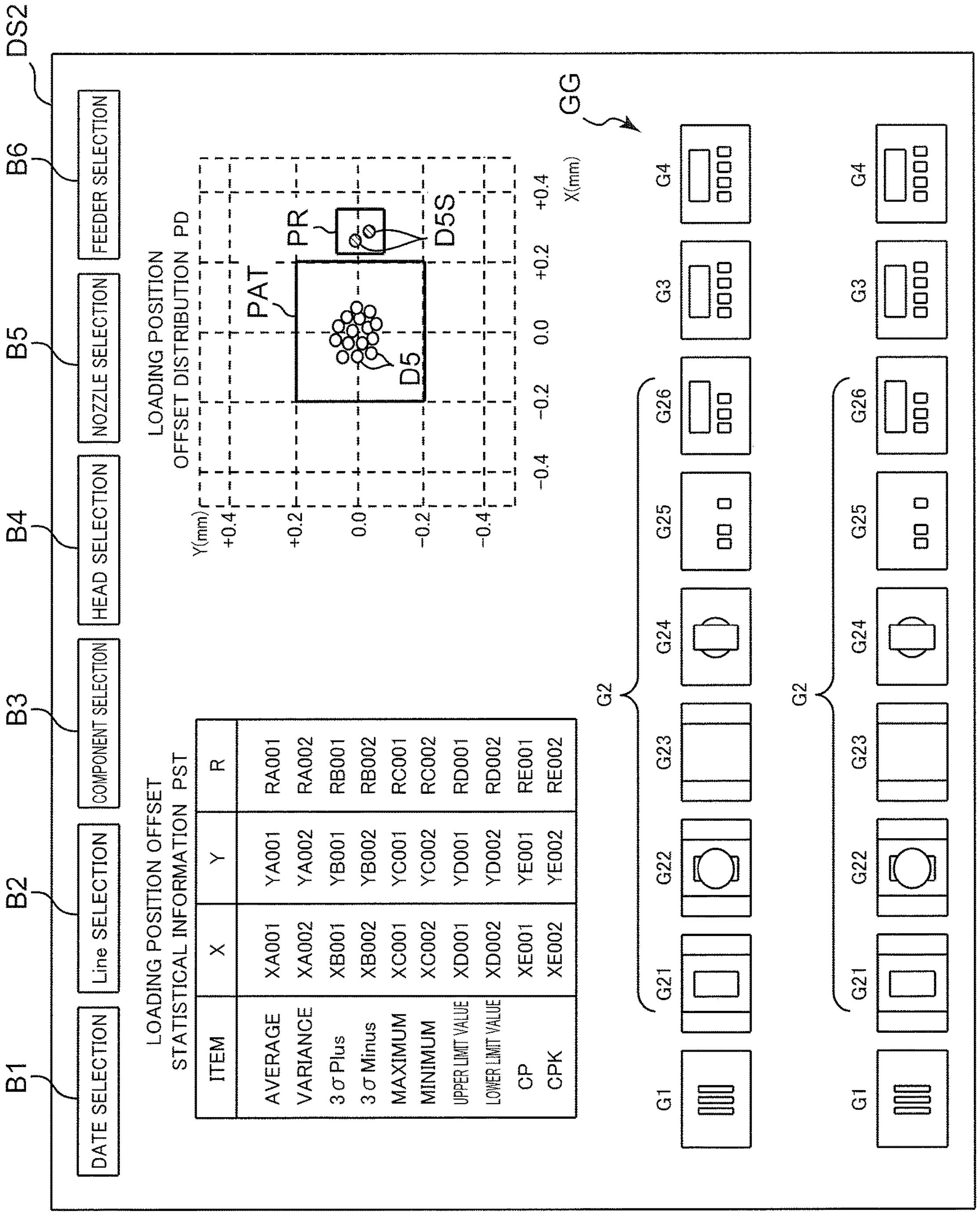
FIG. 8 is a view showing the display screen of the management display unit, showing a state in which loading position offset distribution is displayed.

When a loading offset display command to display the position offset status of the component loading position on the component loading board PPA is input via the management operation unit 163, the management control unit 165 causes the management display unit 162 to display a display screen DS2 as shown in FIG. 8. Specifically, based on various management data DM accumulated and stored in the management storage unit 164, the management control unit 165 causes the display screen DS2 of the management display unit 162 to display loading position offset distribution PD indicating distribution of the data group including each loading position offset data D5 included in various management data DM. The loading position offset distribution PD is represented by, for example, an "XY offset distribution" indicating distribution of the position offset in the X and Y coordinates about the position offset amount of the actual component loading position with respect to the target loading position on the component loading board PPA indicated by each loading position offset data D5.

Based on the loading position offset distribution PD displayed in the management display unit 162, the operator can visually check the generating status of the position offset of the actual component loading position on the component loading board PPA produced by the mounting apparatus 12. By comparing the suction position offset distribution AD with the loading position offset distribution PD shown in the management display unit 162, the operator can confirm whether the position offset of the actual component suction position by the suction nozzle 2511 affects the position offset of the actual component loading position on the component loading board PPA.

At this time, the management control unit 165 may control the management display unit 162 such that loading position offset statistical information PST indicating the statistics of the data group including each loading position offset data D5 is displayed simultaneously with the loading position offset distribution PD.

The management control unit 165 controls the management display unit 162 such that the date selection region B1, the Line selection region B2, the component selection region B3, the head selection region B4, the nozzle selection region B5, and the feeder selection region B6 that allow an input operation via the management operation unit 163 are set on the display screen DS2. By using the management operation unit 163 to operate the date selection region B1, the operator can select the acquisition date or acquisition period by the data calculation unit 1333 of the inspection control unit 133 for each loading position offset data D5 that constitutes the loading position offset distribution PD. By using the management operation unit 163 to operate the Line selection region B2, the operator can select the mounting apparatus 12 corresponding to each loading position offset data D5 that constitutes the loading position offset distribution PD, and the like. The component selection region B3, the head selection region B4, the nozzle selection region B5, and the feeder selection region B6 that are set on the display screen DS2 are regions to input a command to select one piece of parameter information from the component information D21, the head information D22, the nozzle information D23, and the feeder information D24 that constitute the parameter information D2 associated with the loading position offset data D5, in a similar manner to the display screen DS1 described above.

The management control unit 165 causes the management display unit 162 to display the loading position offset distribution PD focusing on one piece of information selected from the parameter information D2 to be switchable as the parameter selection changes. Specifically, the management control unit 165 controls the management display unit 162 such that, when a command to select the component information D21 from the parameter information D2 is input via the management operation unit 163, the loading position offset distribution PD focusing on the component identified by the component information D21 is displayed. Similarly, the management control unit 165 controls the management display unit 162 such that, when a command to select the head information D22 from the parameter information D2 is input via the management operation unit 163, the loading position offset distribution PD focusing on the loading head 251 identified by the head information D22 is displayed. The management control unit 165 controls the management display unit 162 such that, when a command to select the nozzle information D23 from the parameter information D2 is input via the management operation unit 163, the loading position offset distribution PD focusing on the suction nozzle 2511 identified by the nozzle information D23 is displayed. The management control unit 165 controls the management display unit 162 such that, when a command to select the feeder information D24 from the parameter information D2 is input via the management operation unit 163, the loading position offset distribution PD focusing on the feeder 24F identified by the feeder information D24 is displayed.

In this way, the management display unit 162 displays the loading position offset distribution PD focusing on one piece of information selected via the management operation unit 163 from the parameter information D2 based on the control of the management display unit 162 by the management control unit 165. This allows the operator to identify the generating factor for the loading position offset while visually checking the generating status of component loading position offset on the component loading board PPA.

Assume a case where the loading position offset data D5 exists that exceeds a loading offset allowable range PAT indicating the allowable range of the offset amount of the loading position of the component on the component loading board PPA in the loading position offset distribution PD. In this case, the management control unit 165 may control the management display unit 162 such that the loading position offset data D5 exceeding the loading offset allowable range PAT is displayed in a different display mode from the display mode of other position offset data. For example, the management control unit 165 controls the management display unit 162 such that the display color of the plot of the loading position offset data D5 exceeding the loading offset allowable range PAT is different from the display color of other position offset data.

As shown in FIG. 8, assume a case where a command to select one or more specific position offset data D5S from the data group of the loading position offset data D5 constituting the loading position offset distribution PD is input via the management operation unit 163, with the loading position offset distribution PD displayed in the management display unit 162. In this case, the management control unit 165 controls the management display unit 162 such that the image group GG including the first supply processing image G21, the second supply processing image G22, the third supply processing image G23, the suction processing image G24, the first loading processing image G25, and the second loading processing image G26 that constitute the processing state image G2 corresponding to the specific position offset data D5S, and the loading board image G3 is displayed simultaneously with the loading position offset distribution PD. FIG. 8 shows an example where two specific position offset data D5S included in the predetermined selection region PR from the data group of the loading position offset data D5 that constitutes the loading position offset distribution PD are selected. In this case, the management control unit 165 controls the management display unit 162 such that two pairs of image groups GG corresponding to the two specific position offset data D5S are displayed simultaneously with the loading position offset distribution PD.

By checking each image that constitutes the processing state image G2 and the loading board image G3 displayed in the management display unit 162 simultaneously with the loading position offset distribution PD in response to a selection command of the specific position offset data D5S via the management operation unit 163, the operator can confirm whether the position offset of the component suction position by the suction nozzle 2511 affects the position offset of the component loading position on the component loading board PPA.

In the present embodiment, when the command to select the specific position offset data D5S is input via the management operation unit 163, the management control unit 165 controls the management display unit 162 such that the image group GG including the pattern board image G1 and the reflow board image G4 in addition to the processing state image G2 and the loading board image G3 is displayed simultaneously with the loading position offset distribution PD. By checking the pattern board image G1 displayed simultaneously with the loading position offset distribution PD in the management display unit 162, the operator can confirm the influence of the formation status of the solder paste pattern on the loading position offset. By checking the reflow board image G4 displayed simultaneously with the loading position offset distribution PD in the management display unit 162, the operator can confirm the position offset status of the component on the reflow board PPB or the like after the reflow process.

When a simultaneous display command to simultaneously display each position offset status of the suction position and the loading position is input via the management operation unit 163, the management control unit 165 causes the management display unit 162 to display a display screen DS3 as shown in FIG. 9. Specifically, based on each management data DM accumulated and stored in the management storage unit 164, the management control unit 165 causes the display screen DS3 of the management display unit 162 to simultaneously display the suction position offset distribution AD of each suction position offset data D1 included in each management data DM and the loading position offset distribution PD of each loading position offset data D5 included in each management data DM. Based on the information displayed in the management display unit 162, the operator can easily make a comparison between the suction position offset distribution AD and the loading position offset distribution PD. Therefore, the operator can easily confirm whether the position offset of the component suction position by the suction nozzle 2511 affects the position offset of the component loading position on the component loading board PPA.

At this time, the management control unit 165 may control the management display unit 162 such that the suction position offset statistical information AST and the loading position offset statistical information PST are displayed simultaneously with the suction position offset distribution AD and the loading position offset distribution PD.

The management control unit 165 controls the management display unit 162 such that the date selection region B1, the Line selection region B2, the component selection region B3, the head selection region B4, the nozzle selection region B5, and the feeder selection region B6 that allow an input operation via the management operation unit 163 are set on the display screen DS3. The operator can select the acquisition date or acquisition period of each suction position offset data D1 that constitutes the suction position offset distribution AD and each loading position offset data D5 that constitutes the loading position offset distribution PD by using the management operation unit 163 to operate the date selection region B1. The operator can select the mounting apparatus 12 corresponding to each suction position offset data D1 that constitutes the suction position offset distribution AD, each loading position offset data D5 that constitutes the loading position offset distribution PD, and the like by using the management operation unit 163 to operate the Line selection region B2. The component selection region B3, the head selection region B4, the nozzle selection region B5, and the feeder selection region B6 that are set on the display screen DS3 are regions to input a command to select one piece of parameter information from the component information D21, the head information D22, the nozzle information D23, and the feeder information D24 that constitute the parameter information D2 associated with the suction position offset data D1 and the loading position offset data D5, in a similar manner to the display screens DS1 and DS2 described above.

The management control unit 165 causes the management display unit 162 to simultaneously display the suction position offset distribution AD and the loading position offset distribution PD focusing on one piece of information selected from the parameter information D2 to be switchable as the parameter selection changes. Specifically, the management control unit 165 controls the management display unit 162 such that, when a command to select the component information D21 from the parameter information D2 is input via the management operation unit 163, the suction position offset distribution AD and the loading position offset distribution PD focusing on the component identified by the component information D21 are simultaneously displayed. Similarly, the management control unit 165 controls the management display unit 162 such that, when a command to select the head information D22 from the parameter information D2 is input via the management operation unit 163, the suction position offset distribution AD and the loading position offset distribution PD focusing on the loading head 251 identified by the head information D22 are simultaneously displayed. Specifically, the management control unit 165 controls the management display unit 162 such that, when a command to select the nozzle information D23 from the parameter information D2 is input via the management operation unit 163, the suction position offset distribution AD and the loading position offset distribution PD focusing on the suction nozzle 2511 identified by the nozzle information D23 are simultaneously displayed. The management control unit 165 controls the management display unit 162 such that, when a command to select the feeder information D24 from the parameter information D2 is input via the management operation unit 163, the suction position offset distribution AD and the loading position offset distribution PD focusing on the feeder 24F identified by the feeder information D24 are simultaneously displayed.

In this way, the management display unit 162 displays the suction position offset distribution AD and the loading position offset distribution PD focusing on one piece of information selected from the parameter information D2 via the management operation unit 163 based on the control of the management display unit 162 by the management control unit 165. This allows the operator to easily compare the suction position offset distribution AD with the loading position offset distribution PD.

As shown in FIG. 9, assume a case where a command to select one or more specific position offset data from the data group of one position offset distribution is input via the management operation unit 163, with the suction position offset distribution AD and the loading position offset distribution PD simultaneously displayed in the management display unit 162. FIG. 9 shows an example where two specific position offset data D1S included in a predetermined selection region PR from the data group of the suction position offset data D1 that constitutes the suction position offset distribution AD are selected. In this case, the management control unit 165 may control the management display unit 162 such that the image group GG including the first supply processing image G21, the second supply processing image G22, the third supply processing image G23, the suction processing image G24, the first loading processing image G25, and the second loading processing image G26 that constitute the processing state image G2 corresponding to the specific position offset data DIS, and the loading board image G3 is displayed simultaneously with the suction position offset distribution AD and the loading position offset distribution PD. Note that with the suction position offset distribution AD and the loading position offset distribution PD simultaneously displayed in the management display unit 162, the management control unit 165 may not display the image group GG simultaneously.

When the image group GG is displayed in the management display unit 162 simultaneously with the suction position offset distribution AD and the loading position offset distribution PD, by checking each image that constitutes the processing state image G2 and the loading board image G3 displayed in the management display unit 162 in response to the selection command of the specific position offset data D1S via the management operation unit 163, the operator can confirm whether the position offset of the component suction position by the suction nozzle 2511 affects the position offset of the component loading position on the component loading board PPA. In the present embodiment, when a command to select the specific position offset data D1S is input via the management operation unit 163, the management control unit 165 controls the management display unit 162 such that the image group GG including the pattern board image G1 and the reflow board image G4 in addition to the processing state image G2 and the loading board image G3 is displayed simultaneously with the suction position offset distribution AD and the loading position offset distribution PD. By checking the pattern board image G1 displayed in the management display unit 162, the operator can confirm the influence of the formation status of the solder paste pattern on the suction position offset and the loading position offset. By checking the reflow board image G4 displayed in the management display unit 162, the operator can confirm the position offset status of the component on the reflow board PPB after the reflow process.

Furthermore, assume a case where a command to select one or more specific position offset data from the data group of one position offset distribution is input via the management operation unit 163, with the suction position offset distribution AD and the loading position offset distribution PD simultaneously displayed in the management display unit 162. As described above, FIG. 9 shows an example where two specific position offset data D1S included in the predetermined selection region PR are selected from the data group of the suction position offset data D1 that constitutes the suction position offset distribution AD as one position offset distribution. In this case, the management control unit 165 controls the management display unit 162 such that, in the data group of the loading position offset distribution PD as the other position offset distribution, attention data D5A corresponding to the specific position offset data D1S is displayed in a different display mode from the display mode of the residual data. For example, the management control unit 165 controls the management display unit 162 such that, in the data group of the loading position offset data D5 that constitutes the loading position offset distribution PD, the brightness and contrast of the plot of the attention data D5A is different from the residual data.

Accordingly, in the suction position offset distribution AD and the loading position offset distribution PD simultaneously displayed in the management display unit 162, the correspondence between the specific position offset data D1S and the attention data D5A becomes clear. Therefore, the operator can accurately confirm the correspondence between the specific position offset data D1S selected via the management operation unit 163 and the attention data D5A. As a result, the operator can more easily confirm whether the position offset of the component suction position by the suction nozzle 2511 affects the position offset of the component loading position on the component loading board PPA.

Figure 10:
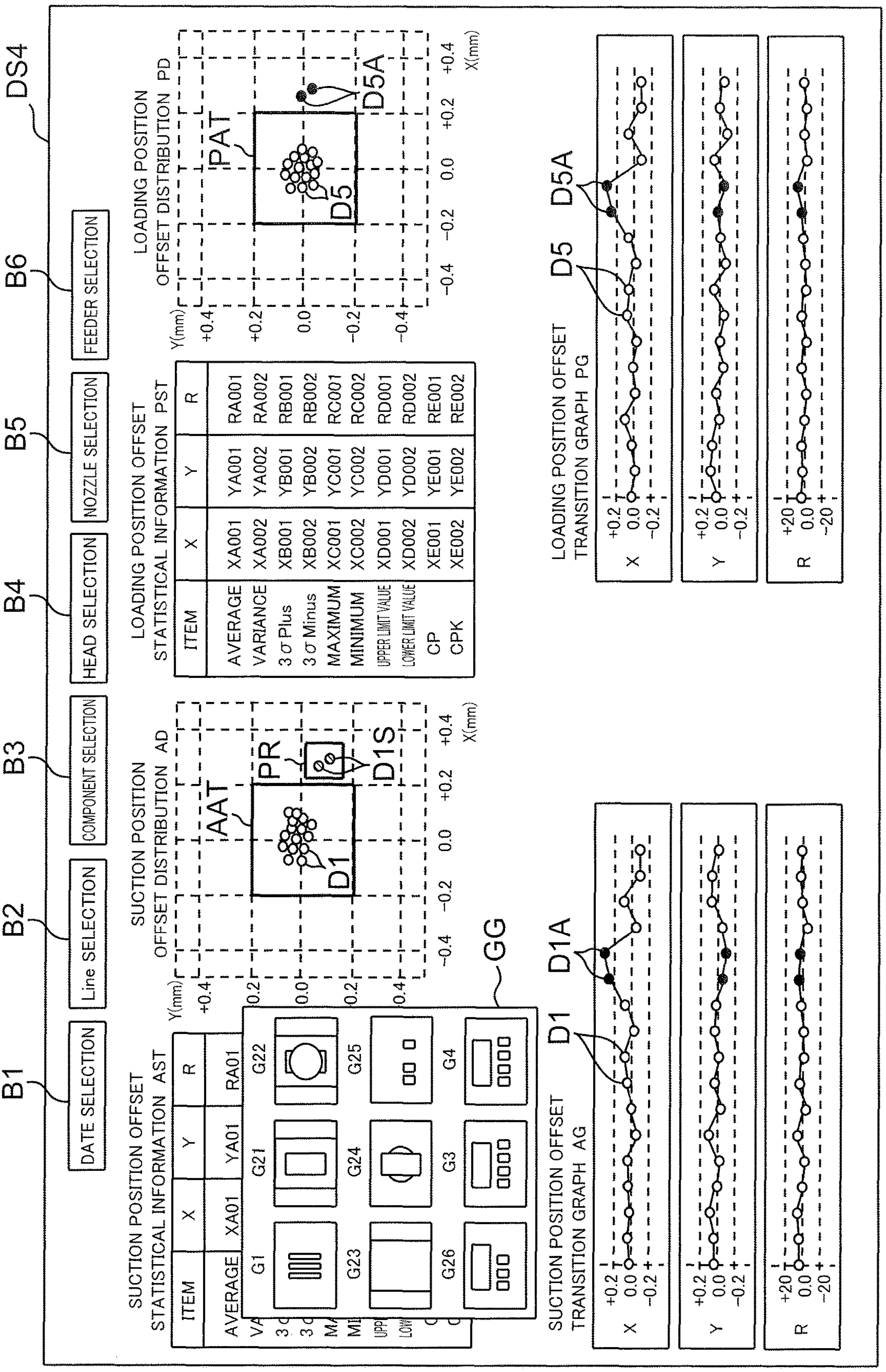
FIG. 10 is a view showing the display screen of the management display unit, showing a state in which the suction position offset distribution, the loading position offset distribution, a suction position offset transition graph, and a loading position offset transition graph are displayed simultaneously.

The management control unit 165 may be configured to cause the management display unit 162 to display a display screen DS4 illustrated in FIG. 10 when a command to select one piece of information from the parameter information D2 is input via the management operation unit 163. Specifically, the management control unit 165 controls the management display unit 162 such that at least one transition graph of an suction position offset transition graph AG and a loading position offset transition graph PG is displayed simultaneously with the suction position offset distribution AD and the loading position offset distribution PD, in addition to the image group GG. The suction position offset transition graph AG is a graph indicating the temporal transition of the data group of the suction position offset data D1. The suction position offset transition graph AG is about the offset amount of the component suction position with respect to the suction nozzle 2511, and includes a graph indicating the temporal transition of the offset amount in the X direction, a graph indicating the temporal transition of the offset amount in the Y direction, and a graph indicating the temporal transition of the offset amount in the R direction (rotational direction). The loading position offset transition graph PG is a graph indicating the temporal transition of the data group of the loading position offset data D5. The loading position offset transition graph PG is about the offset amount of the component loading position on the pattern forming board PP in the component loading process by the loading head 251, and includes a graph indicating the temporal transition of the offset amount in the X direction, a graph indicating the temporal transition of the offset amount in the Y direction, and a graph indicating the temporal transition of the offset amount in the R direction (rotational direction).

This allows the management control unit 165 to cause the management display unit 162 to display the temporal transition of the suction position offset data D1 and the loading position offset data D5 as graphic visualization simultaneously with the suction position offset distribution AD and the loading position offset distribution PD. Therefore, the operator can check the temporal transition of the position offset based on the suction position offset transition graph AG and the loading position offset transition graph PG while visually checking the generating status of the position offset based on the suction position offset distribution AD and the loading position offset distribution PD.

At this time, assume a case where the command to select one or more specific position offset data from the data group of one position offset distribution of the suction position offset distribution AD and the loading position offset distribution PD is input via the management operation unit 163, with the suction position offset distribution AD, the loading position offset distribution PD, the suction position offset transition graph AG, and the loading position offset transition graph PG simultaneously displayed in the management display unit 162. FIG. 10 shows an example where two specific position offset data D1S included in the predetermined selection region PR are selected from the data group of the suction position offset data D1 that constitutes the suction position offset distribution AD as one position offset distribution. In this case, the management control unit 165 controls the management display unit 162 such that, in the data group of each of the loading position offset distribution PD, the suction position offset transition graph AG, and the loading position offset transition graph PG as the other position offset distribution, the attention data corresponding to the specific position offset data D1S is displayed in a different display mode from the display mode of the residual data.

Specifically, in the data group of the loading position offset data D5 that constitutes the loading position offset distribution PD, the attention data D5A corresponding to the specific position offset data D1S is displayed in a different display mode from the display mode of the residual data. Similarly, in the data group of the suction position offset data D1 that constitutes the suction position offset transition graph AG, attention data D1A corresponding to the specific position offset data D1S is displayed in a different display mode from the display mode of the residual data. In the data group of the loading position offset data D5 that constitutes the loading position offset transition graph PG, the attention data D5A corresponding to the specific position offset data D1S is displayed in a different display mode from the display mode of the residual data. For example, the management control unit 165 controls the management display unit 162 such that the brightness and contrast of the plot of the attention data D5A in the loading position offset distribution PD, the attention data D1A in the suction position offset transition graph AG, and the attention data D5A in the loading position offset transition graph PG are different from the residual data.

Therefore, the correspondence of respective position offset data becomes clear in the suction position offset distribution AD, the loading position offset distribution PD, the suction position offset transition graph AG, and the loading position offset transition graph PG that are simultaneously displayed in the management display unit 162. This allows the operator to accurately confirm the correspondence between the suction position offset data D1 and the loading position offset data D5, including the temporal transition. As a result, the operator can easily confirm whether the position offset of the component suction position by the suction nozzle 2511 affects the position offset of the component loading position on the component loading board PPA, including the temporal factor.

Assume a case where the command to select one or more specific position offset data from the data group of one position offset distribution of the suction position offset distribution AD and the loading position offset distribution PD is input via the management operation unit 163, with the suction position offset distribution AD, the loading position offset distribution PD, and at least one transition graph of the suction position offset transition graph AG and the loading position offset transition graph PG simultaneously displayed in the management display unit 162. In this case, the management control unit 165 controls the management display unit 162 such that, in the data group of each of the loading position offset distribution PD as the other position offset distribution, and the transition graph displayed in the management display unit 162 among the suction position offset transition graph AG and the loading position offset transition graph PG, the attention data corresponding to the specific position offset data D1S is displayed in a different display mode from the display mode of the residual data.

Figure 11:
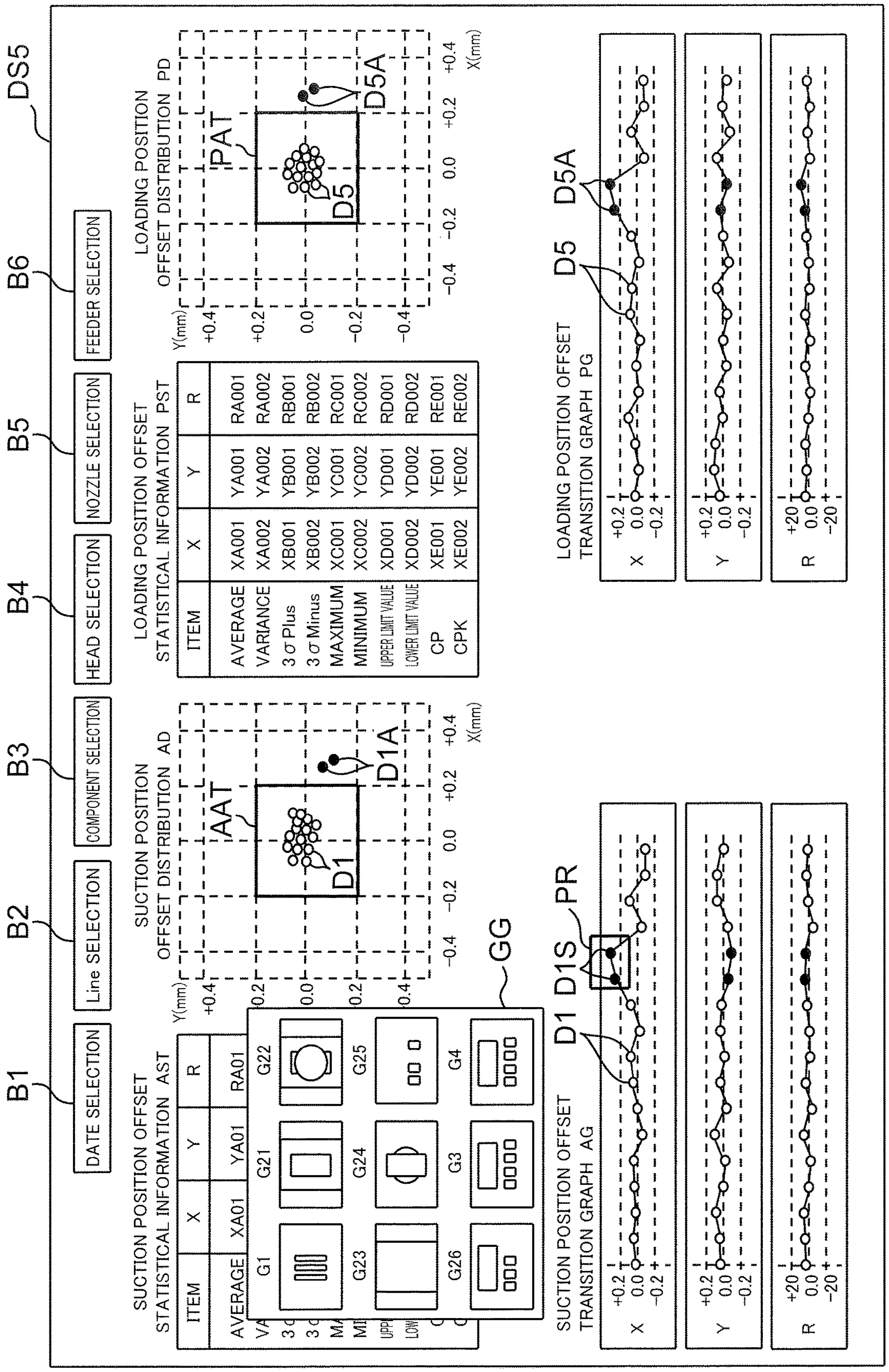
FIG. 11 is a view showing another example of a display mode in a case where the suction position offset distribution, the loading position offset distribution, the suction position offset transition graph, and the loading position offset transition graph are displayed simultaneously.

As in a display screen DS5 illustrated in FIG. 11, assume a case where a command to select one or more specific position offset data is input via the management operation unit 163 from the data group of one position offset transition graph of the suction position offset transition graph AG and the loading position offset transition graph PG, with the suction position offset distribution AD, the loading position offset distribution PD, the suction position offset transition graph AG, and the loading position offset transition graph PG simultaneously displayed in the management display unit 162. FIG. 11 shows an example where two specific position offset data D1S included in the predetermined selection region PR from the data group of the suction position offset data D1 that constitutes the suction position offset transition graph AG as one position offset transition graph are selected. In this case, the management control unit 165 controls the management display unit 162 such that, in the data group of each of the loading position offset transition graph PG as the other position offset transition graph, the suction position offset distribution AD, and the loading position offset distribution PD, the attention data corresponding to the specific position offset data D1S is displayed in a different display mode from the display mode of the residual data.

Specifically, in the data group of the loading position offset data D5 that constitutes the loading position offset transition graph PG, the attention data D5A corresponding to the specific position offset data D1S is displayed in a different display mode from the display mode of the residual data. Similarly, in the data group of the suction position offset data D1 that constitutes the suction position offset distribution AD, the attention data D1A corresponding to the specific position offset data DIS is displayed in a different display mode from the display mode of the residual data. In the data group of the loading position offset data D5 that constitutes the loading position offset distribution PD, the attention data D5A corresponding to the specific position offset data D1S is displayed in a different display mode from the display mode of the residual data. For example, the management control unit 165 controls the management display unit 162 such that the brightness and contrast of the plot of the attention data D5A in the loading position offset transition graph PG, the attention data D1A in the suction position offset distribution AD, and the attention data D5A in the loading position offset distribution PD are different from the residual data.

Therefore, the correspondence of respective position offset data becomes clear in the suction position offset distribution AD, the loading position offset distribution PD, the suction position offset transition graph AG, and the loading position offset transition graph PG that are simultaneously displayed in the management display unit 162. This allows the operator to accurately confirm the correspondence between the suction position offset data D1 and the loading position offset data D5, including the temporal transition.

Assume a case where the command to select one or more specific position offset data from the data group of the transition graph displayed in the management display unit 162 is input via the management operation unit 163, with the suction position offset distribution AD and the loading position offset distribution PD, and at least one transition graph of the suction position offset transition graph AG and the loading position offset transition graph PG simultaneously displayed in the management display unit 162. In this case, the management control unit 165 controls the management display unit 162 such that, in each data group of a transition graph when the transition graph different from the transition graph subjected to the command by the management operation unit 163 is displayed in the management display unit 162, and the suction position offset distribution AD and the loading position offset distribution PD, the attention data corresponding to the specific position offset data is displayed in a different display mode from the display mode of the residual data.

Figure 12:
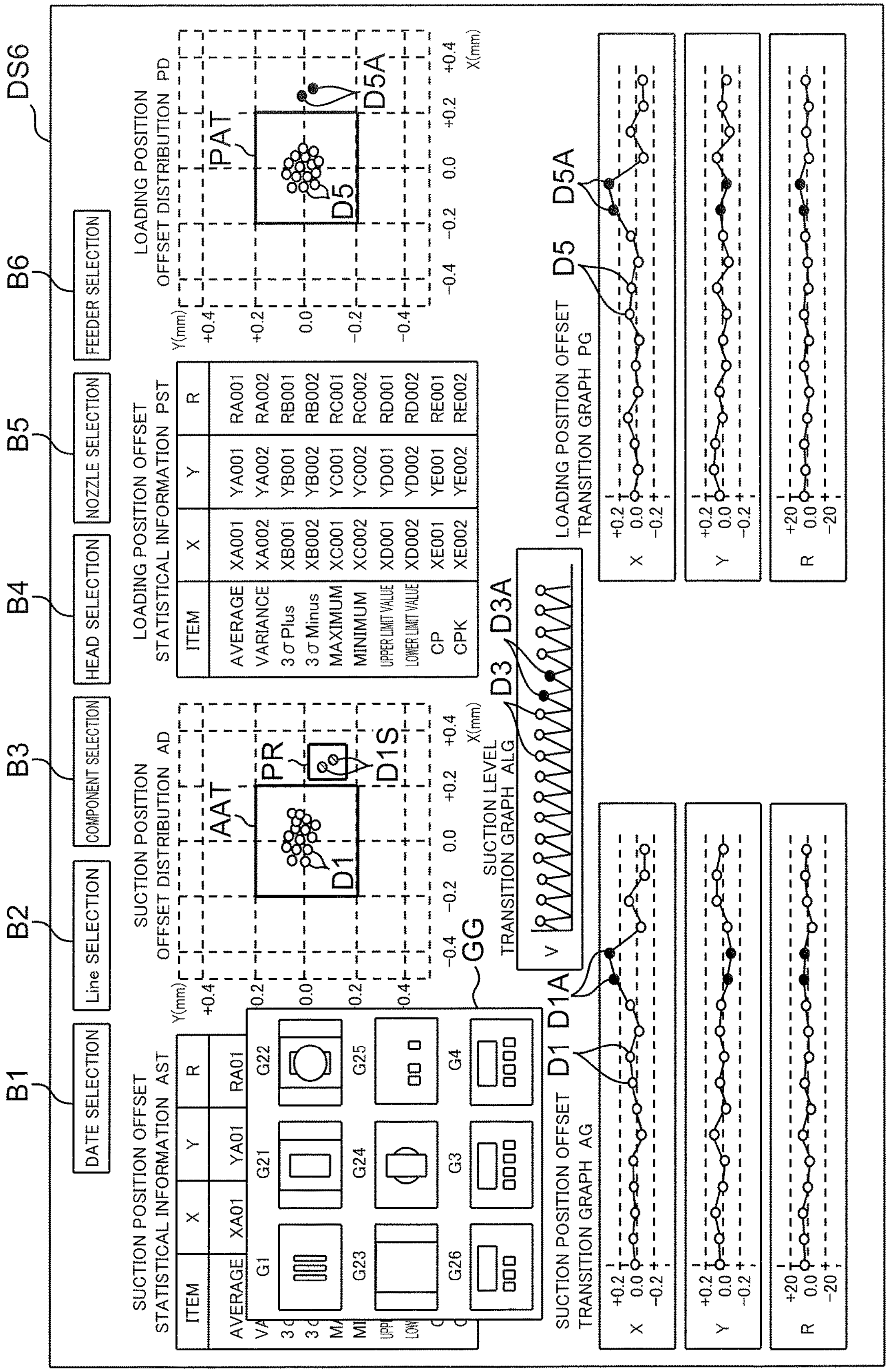
FIG. 12 is a view showing the display screen of the management display unit, showing a state in which a suction level transition graph is displayed.

The management control unit 165 may be configured to cause the management display unit 162 to display a display screen DS6 illustrated in FIG. 12 when a command to select one piece of information from the parameter information D2 is input via the management operation unit 163. Specifically, the management control unit 165 controls the management display unit 162 such that a suction level transition graph ALG is displayed simultaneously with the suction position offset distribution AD and the loading position offset distribution PD, in addition to the image group GG. The suction level transition graph ALG is a graph indicating temporal transition of the data group of the suction level data D3 included in each management data DM accumulated and stored in the management storage unit 164. Note that the management control unit 165 may control the management display unit 162 such that the suction position offset transition graph AG, the loading position offset transition graph PG, and the suction level transition graph ALG are displayed simultaneously with the suction position offset distribution AD and the loading position offset distribution PD.

This allows the management control unit 165 to cause the management display unit 162 to display the temporal transition of the suction level data D3 indicating the component suction level by the suction nozzle 2511 as graphic visualization simultaneously with the suction position offset distribution AD and the loading position offset distribution PD. Therefore, the operator can check the temporal transition of the suction level data D3 based on the suction level transition graph ALG while visually checking the generating status of the position offset based on the suction position offset distribution AD and the loading position offset distribution PD.

At this time, assume a case where a command to select one or more specific position offset data from the data group of one position offset distribution of the suction position offset distribution AD and the loading position offset distribution PD is input via the management operation unit 163, with the suction position offset distribution AD, the loading position offset distribution PD, and the suction level transition graph ALG simultaneously displayed in the management display unit 162. FIG. 12 shows an example where two specific position offset data D1S included in the predetermined selection region PR are selected from the data group of the suction position offset data D1 that constitutes the suction position offset distribution AD as one position offset distribution. In this case, the management control unit 165 controls the management display unit 162 such that, in the data group of each of the loading position offset distribution PD and the suction level transition graph ALG as the other position offset distribution, the attention data corresponding to the specific position offset data DIS is displayed in a different display mode from the display mode of the residual data.

Specifically, in the data group of the loading position offset data D5 that constitutes the loading position offset distribution PD, the attention data D5A corresponding to the specific position offset data D1S is displayed in a different display mode from the display mode of the residual data. Similarly, in the data group of the suction level data D3 that constitutes the suction level transition graph ALG, attention data D3A corresponding to the specific position offset data DIS is displayed in a different display mode from the display mode of the residual data. For example, the management control unit 165 controls the management display unit 162 such that the brightness and contrast of the plot of the attention data D5A in the loading position offset distribution PD and the attention data D3A in the suction level transition graph ALG are different from the residual data.

Accordingly, in the suction position offset distribution AD, the loading position offset distribution PD, and the suction level transition graph ALG that are displayed simultaneously in the management display unit 162, the correspondence between the position offset data D1, D5 and the suction level data D3 becomes clear. Therefore, the operator can accurately confirm the correspondence between the position offset data D1, D5 and the suction level data D3. As a result, the operator can confirm whether the position offset of the component suction position by the suction nozzle 2511 affects the position offset of the component loading position on the component loading board PPA by focusing on the component suction level by the suction nozzle 2511.

The management control unit 165 may be configured to calculate a normal suction rate based on the suction state data D4 included in each management data DM accumulated and stored in the management storage unit 164. Specifically, the management control unit 165 calculates the normal suction rate about the component, the loading head 251, the suction nozzle 2511, and the feeder 24F respectively indicated by the component information D21, the head information D22, the nozzle information D23, and the feeder information D24 that constitute the parameter information D2. The normal suction rate indicates the proportion of the number of times of use in the situation where the suction state indicated by the suction state data D4 is normal to the total number of times of use in a predetermined designated period about each of the component, the loading head 251, the suction nozzle 2511, and the feeder 24F. That is, when considering each type of the component, each type of the loading head 251, each type of the suction nozzle 2511, and each type of the feeder 24F, as the normal suction rate increases, the number of times of use increases in a situation where the suction state of the component by the suction nozzle 2511 is normal. Therefore, as the normal suction rate increases, it is more difficult to think the generating factor for the suction position offset and the loading position offset.

Figure 13:
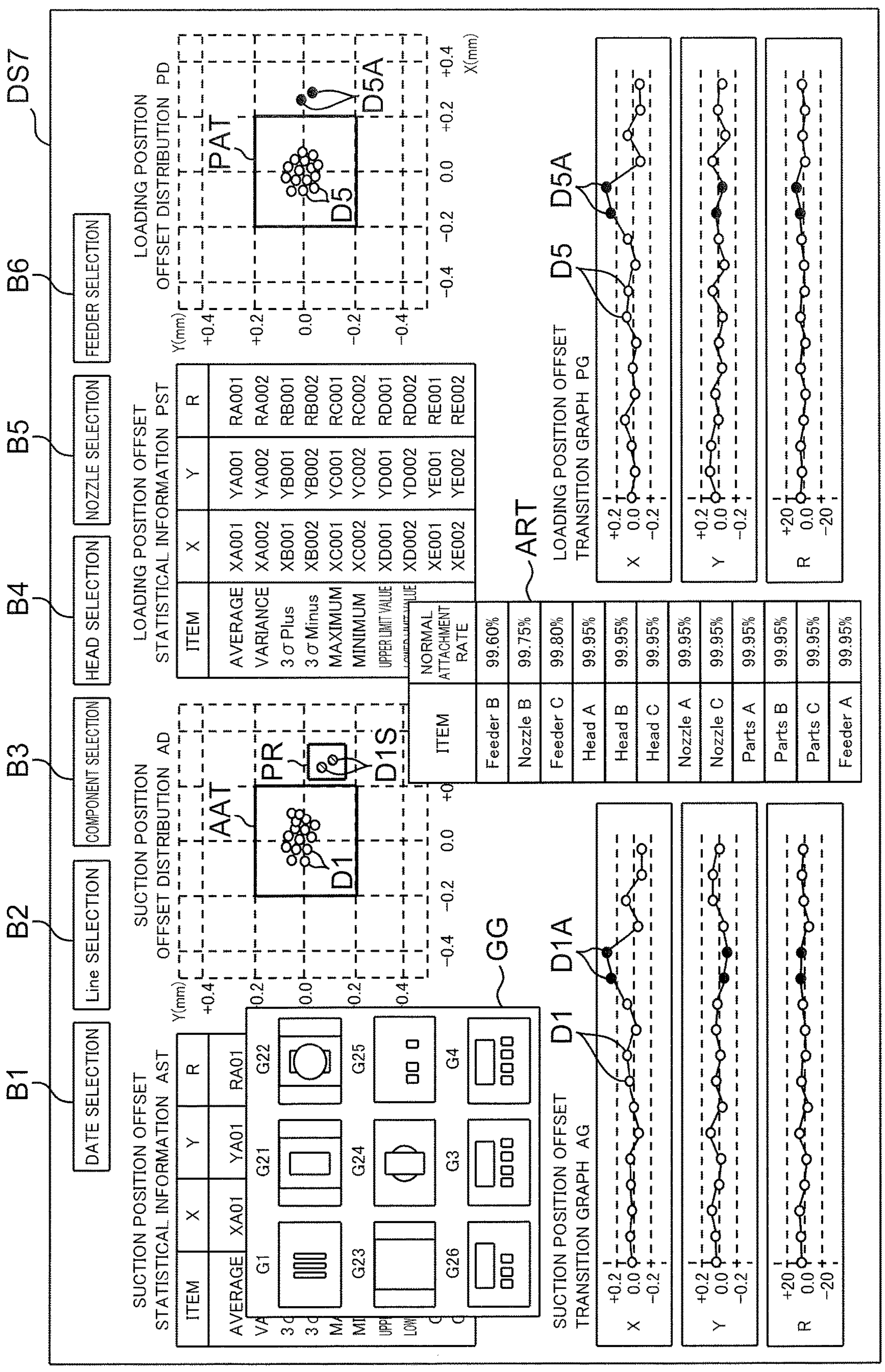
FIG. 13 is a view showing the display screen of the management display unit, showing a state in which a normal suction rate table is displayed.

As in a display screen DS7 illustrated in FIG. 13, the management control unit 165 controls the management display unit 162 such that a normal suction rate table ART indicating the normal suction rate in a tabular form is displayed, with the suction position offset distribution AD and the loading position offset distribution PD simultaneously displayed in the management display unit 162. Specifically, assume a case where the command to select one or more specific position offset data from the data group of one position offset distribution is input via the management operation unit 163, with the suction position offset distribution AD and the loading position offset distribution PD simultaneously displayed in the management display unit 162. FIG. 13 shows an example where two specific position offset data D1S included in the predetermined selection region PR are selected from the data group of the suction position offset data D1 that constitutes the suction position offset distribution AD as one position offset distribution. In this case, the management control unit 165 controls the management display unit 162 such that the normal suction rate table ART including the normal suction rate in each of the component, the loading head 251, the suction nozzle 2511, and the feeder 24F indicated by the parameter information D2 corresponding to the specific position offset data D1S is displayed. Note that the management control unit 165 may control the management display unit 162 such that the suction position offset transition graph AG, the loading position offset transition graph PG, and the normal suction rate table ART are displayed simultaneously with the suction position offset distribution AD and the loading position offset distribution PD, in addition to the image group GG.

The operator can check the normal suction rate in each of the component, the loading head 251, the suction nozzle 2511, and the feeder 24F based on the normal suction rate table ART displayed in the management display unit 162. This allows the operator to easily identify the generating factor for the suction position offset and the loading position offset.

Note that the above-described specific embodiment mainly includes the disclosure having the following configurations.

A component mounting system according to one aspect of the present disclosure includes: a mounting apparatus including a feeder configured to execute a component supply process of supplying a component and a loading head including a suction nozzle that executes a component suction process of sucking the component to obtain a component loading board by executing a component loading process of loading the component sucked by the suction nozzle on a board; and a management device connected to the mounting apparatus to allow data communication. The management device includes a management communication unit configured to acquire: suction position offset data indicating an offset amount of a suction position of the component with respect to the suction nozzle in the component suction process; loading position offset data indicating an offset amount of a loading position of the component with respect to the board in the component loading process; and various pieces of parameter information to identify each of the component, the feeder, the suction nozzle, and the loading head used in each process of the component supply process, the component suction process, and the component loading process. The management device further includes a management storage unit configured to accumulate and store management data in which the suction position offset data, the loading position offset data, and the various pieces of parameter information are associated with each other; a management display unit configured to display information on the management data; a management operation unit into which a command regarding a display mode of the management display unit is input; and a management control unit configured to control the management display unit in response to the command input into the management operation unit. The management control unit controls the management display unit such that, when a command to select one piece of parameter information from the various pieces of parameter information is input via the management operation unit, suction position offset distribution indicating distribution of a data group of the suction position offset data focusing on the one piece of parameter information, and loading position offset distribution indicating distribution of a data group of the loading position offset data are simultaneously displayed. Furthermore, the management control unit controls the management display unit such that, when a command to select one or more specific position offset data from the data group of one position offset distribution is input via the management operation unit, with the suction position offset distribution and the loading position offset distribution simultaneously displayed in the management display unit, attention data corresponding to the specific position offset data is displayed in a different display mode from a display mode of residual data in the data group of another position offset distribution.

With this component mounting system, when the command to select one piece of parameter information from the various pieces of parameter information is input via the management operation unit, the management control unit causes the management display unit to simultaneously display the suction position offset distribution and the loading position offset distribution focusing on the one piece of parameter information. This allows the operator to easily compare the suction position offset distribution with the loading position offset distribution. Therefore, the operator can easily confirm whether the position offset of the component suction position by the suction nozzle affects the position offset of the component loading position on the board.

Assume a case where the command to select the one or more specific position offset data from the data group of one position offset distribution is input via the management operation unit, with the suction position offset distribution and the loading position offset distribution simultaneously displayed in the management display unit. In this case, the management control unit controls the management display unit such that, in the data group of the other position offset distribution, the attention data corresponding to the specific position offset data is displayed in a different display mode from the display mode of the residual data. Accordingly, in the suction position offset distribution and the loading position offset distribution simultaneously displayed in the management display unit, the correspondence between the suction position offset data and the loading position offset data becomes clear. Therefore, the operator can accurately confirm the correspondence between the suction position offset data and the loading position offset data. As a result, the operator can more easily confirm whether the position offset of the component suction position by the suction nozzle affects the position offset of the component loading position on the board.

In the component mounting system, the management control unit may be configured to control the management display unit such that, when the command to select the one piece of parameter information from the various pieces of parameter information is input via the management operation unit, at least one transition graph of a suction position offset transition graph indicating temporal transition of the data group of the suction position offset data and a loading position offset transition graph indicating temporal transition of the data group of the loading position offset data is displayed simultaneously with the suction position offset distribution and the loading position offset distribution.

In this aspect, when the command to select one piece of parameter information from the various pieces of parameter information is input via the management operation unit, the management control unit controls the management display unit such that the suction position offset transition graph and the loading position offset transition graph are displayed simultaneously with the suction position offset distribution and the loading position offset distribution. This allows the management display unit to display the temporal transition of the suction position offset data and the loading position offset data as graphic visualization simultaneously with the suction position offset distribution and the loading position offset distribution. Therefore, the operator can check the temporal transition of the position offset based on the suction position offset transition graph and the loading position offset transition graph while visually checking the generating status of the position offset based on the suction position offset distribution and the loading position offset distribution.

In the component mounting system, the management control unit may be configured to control the management display unit such that, when the command to select the one or more specific position offset data from a data group of one position offset distribution of the suction position offset distribution and the loading position offset distribution is input via the management operation unit, with the suction position offset distribution and the loading position offset distribution, and at least one transition graph of the suction position offset transition graph and the loading position offset transition graph simultaneously displayed in the management display unit, the attention data corresponding to the specific position offset data is displayed in a different display mode from a display mode of residual data in each data group of another position offset distribution, and the transition graph of the suction position offset transition graph and the loading position offset transition graph displayed in the management display unit.

In this aspect, assume a case where the command to select one or more specific position offset data from the data group of one position offset distribution of the suction position offset distribution and the loading position offset distribution is input via the management operation unit, with the suction position offset distribution, the loading position offset distribution, and at least one transition graph of the suction position offset transition graph and the loading position offset transition graph simultaneously displayed in the management display unit. In this case, the management control unit controls the management display unit such that, in each data group of the other position offset distribution and the transition graph displayed in the management display unit, attention data corresponding to the specific position offset data is displayed in a different display mode from the display mode of the residual data. Therefore, the correspondence of respective position offset data becomes clear in the suction position offset distribution, the loading position offset distribution, the suction position offset transition graph, and the loading position offset transition graph that are simultaneously displayed in the management display unit. Therefore, the operator can accurately confirm the correspondence between the suction position offset data and the loading position offset data, including the temporal transition. As a result, the operator can easily confirm whether the position offset of the component suction position by the suction nozzle affects the position offset of the component loading position on the board, including the temporal factor.

In the component mounting system, the management control unit may be configured to control the management display unit such that, when the command to select the one or more specific position offset data from the data group of the transition graph displayed in the management display unit is input via the management operation unit, with the suction position offset distribution and the loading position offset distribution, and at least one transition graph of the suction position offset transition graph and the loading position offset transition graph simultaneously displayed in the management display unit, the attention data corresponding to the specific position offset data is displayed in a different display mode from the display mode of the residual data in the data groups of a transition graph when the transition graph different from the transition graph subjected to the command by the management operation unit is displayed in the management display unit, and the suction position offset distribution and the loading position offset distribution.

In this aspect, assume a case where the command to select one or more specific position offset data from the data group of the transition graph displayed in the management display unit is input via the management operation unit, with the suction position offset distribution, the loading position offset distribution, and at least one transition graph of the suction position offset transition graph and the loading position offset transition graph simultaneously displayed in the management display unit. In this case, the management control unit controls the management display unit such that, in each data group of a transition graph when the transition graph different from the transition graph subjected to the command by the management operation unit is displayed in the management display unit, and the suction position offset distribution and the loading position offset distribution, the attention data corresponding to the specific position offset data is displayed in a different display mode from the display mode of the residual data. Therefore, the correspondence of respective position offset data becomes clear in the suction position offset distribution, the loading position offset distribution, the suction position offset transition graph, and the loading position offset transition graph that are simultaneously displayed in the management display unit. Therefore, the operator can accurately confirm the correspondence between the suction position offset data and the loading position offset data, including the temporal transition.

In the component mounting system, the management communication unit may be configured to acquire, from the mounting apparatus, suction level data indicating a suction level of the component by the suction nozzle in the component suction process, and the management storage unit may be configured to accumulate and store data that is further associated with the suction level data as the management data. In this case, the management control unit controls the management display unit such that, when the command to select the one piece of parameter information from the various pieces of parameter information is input via the management operation unit, a suction level transition graph indicating temporal transition of a data group of the suction level indicated by the suction level data is displayed simultaneously with the suction position offset distribution and the loading position offset distribution.

In this aspect, when the command to select one piece of parameter information from the various pieces of parameter information is input via the management operation unit, the management control unit controls the management display unit such that the suction level transition graph is displayed simultaneously with the suction position offset distribution and the loading position offset distribution. This allows the management display unit to display the temporal transition of the suction level data indicating the component suction level by the suction nozzle as graphic visualization simultaneously with the suction position offset distribution and the loading position offset distribution. Therefore, the operator can confirm the temporal transition of the suction level data based on the suction level transition graph while visually checking the generating status of the position offset based on the suction position offset distribution and the loading position offset distribution.

In the component mounting system, the management control unit may be configured to control the management display unit such that, when the command to select the one or more specific position offset data from the data group of one position offset distribution of the suction position offset distribution and the loading position offset distribution is input via the management operation unit, with the suction position offset distribution, the loading position offset distribution, and the suction level transition graph simultaneously displayed in the management display unit, the attention data corresponding to the specific position offset data is displayed in a different display mode from the display mode of the residual data in the data groups of another position offset distribution and the suction level transition graph.

In this aspect, assume a case where the command to select one or more specific position offset data from the data group of one position offset distribution of the suction position offset distribution and the loading position offset distribution is input via the management operation unit, with the suction position offset distribution, the loading position offset distribution, and the suction level transition graph simultaneously displayed in the management display unit. In this case, the management control unit controls the management display unit such that, in each data group of the other position offset distribution and the suction level transition graph, the attention data corresponding to the specific position offset data is displayed in a different display mode from the display mode of the residual data. Accordingly, in the suction position offset distribution, the loading position offset distribution, and the suction level transition graph that are displayed simultaneously in the management display unit, the correspondence between the position offset data and the suction level data becomes clear. Therefore, the operator can accurately confirm the correspondence between the position offset data and the suction level data. As a result, the operator can confirm whether the position offset of the component suction position by the suction nozzle affects the position offset of the component loading position on the board by focusing on the component suction level by the suction nozzle.

In the component mounting system, the management communication unit may be configured to acquire, from the mounting apparatus, suction state data indicating whether a suction state of the component by the suction nozzle in the component suction process is normal, and the management storage unit may be configured to accumulate and store data that is further associated with the suction state data as the management data. In this case, the management control unit calculates a normal suction rate indicating a proportion of a number of times of use in a situation where the suction state is normal to a total number of times of use in a designated period about each of the component, the feeder, the suction nozzle, and the loading head indicated by the various pieces of parameter information based on the suction state data. The management control unit controls the management display unit such that, when the command to select the one or more specific position offset data from the data group of one position offset distribution is input via the management operation unit, with the suction position offset distribution and the loading position offset distribution simultaneously displayed in the management display unit, the normal suction rate in each of the component, the feeder, the suction nozzle, and the loading head indicated by the various pieces of parameter information corresponding to the specific position offset data is displayed.

In this aspect, assume a case where the command to select the one or more specific position offset data from the data group of one position offset distribution is input via the management operation unit, with the suction position offset distribution and the loading position offset distribution simultaneously displayed in the management display unit. In this case, the management control unit controls the management display unit such that the normal suction rate in each of the component, the feeder, the suction nozzle, and the loading head indicated by the various pieces of parameter information corresponding to the specific position offset data is displayed. By checking the normal suction rate in each of the component, the feeder, the suction nozzle, and the loading head displayed in the management display unit, the operator can easily identify the generating factor for the suction position offset and the loading position offset.

As described above, according to the present disclosure, the component mounting system that makes it possible to check the generating status of the position offset of the component suction position by the suction nozzle and identify the generating factor for the position offset can be provided.

The invention claimed is:

1. A component mounting system comprising:

a mounting apparatus including: a feeder configured to execute a component supply process of supplying a component; and a loading head including a suction nozzle that is configured to execute a component suction process of sucking the component to obtain a component loading board by executing a component loading process of loading the component sucked by the suction nozzle on a board; and a management device connected to the mounting apparatus to allow data communication, wherein the management device includes:

a management communication unit configured to acquire: suction position offset data indicating an offset amount of a suction position of the component with respect to the suction nozzle in the component suction process; loading position offset data indicating an offset amount of a loading position of the component with respect to the board in the component loading process; and various pieces of parameter information to identify each of the component, the feeder, the suction nozzle, and the loading head used in each process of the component supply process, the component suction process, and the component loading process;

a management storage configured to accumulate and store management data in which the suction position offset data, the loading position offset data, and the various pieces of parameter information are associated with each other;

a management display configured to display information on the management data;

a management operation unit into which a command regarding a display mode of the management display is input; and a management controller configured to control the management display in response to the command input into the management operation unit, the management controller is configured to control the management display such that, when a command to select one piece of parameter information from the various pieces of parameter information is input via the management operation unit, suction position offset distribution indicating distribution of a data group of the suction position offset data focusing on the one piece of parameter information, and loading position offset distribution indicating distribution of a data group of the loading position offset data are simultaneously displayed, and the management controller is configured to control the management display such that, when a command to select one or more specific position offset data from the data group of one position offset distribution is input via the management operation unit, with the suction position offset distribution and the loading position offset distribution simultaneously displayed in the management display, attention data corresponding to the specific position offset data is displayed in a different display mode from a display mode of residual data in the data group of another position offset distribution.

2. The component mounting system according to claim 1, wherein the management controller is configured to control the management display such that, when the command to select the one piece of parameter information from the various pieces of parameter information is input via the management operation unit, at least one transition graph of a suction position offset transition graph indicating temporal transition of the data group of the suction position offset data and a loading position offset transition graph indicating temporal transition of the data group of the loading position offset data is displayed simultaneously with the suction position offset distribution and the loading position offset distribution.

3. The component mounting system according to claim 2, wherein the management controller is configured to control the management display such that, when the command to select the one or more specific position offset data from a data group of one position offset distribution of the suction position offset distribution and the loading position offset distribution is input via the management operation unit, with the suction position offset distribution and the loading position offset distribution, and at least one transition graph of the suction position offset transition graph and the loading position offset transition graph simultaneously displayed in the management display, the attention data corresponding to the specific position offset data is displayed in a different display mode from a display mode of residual data in each data group of another position offset distribution, and the transition graph of the suction position offset transition graph and the loading position offset transition graph displayed in the management display.

4. The component mounting system according to claim 3, wherein the management controller is configured to control the management display such that, when the command to select the one or more specific position offset data from a data group of a transition graph displayed in the management display is input via the management operation unit, with the suction position offset distribution and the loading position offset distribution, and at least one transition graph of the suction position offset transition graph and the loading position offset transition graph simultaneously displayed in the management display, the attention data corresponding to the specific position offset data is displayed in a different display mode from the display mode of the residual data in the data groups of a transition graph when the transition graph different from the transition graph subjected to the command by the management operation unit is displayed in the management display, and the suction position offset distribution and the loading position offset distribution.

5. The component mounting system according to claim 3, wherein the management communication unit is configured to acquire, from the mounting apparatus, suction level data indicating a suction level of the component by the suction nozzle in the component suction process, the management storage is configured to accumulate and store data that is further associated with the suction level data as the management data, and the management controller is configured to control the management display such that, when the command to select the one piece of parameter information from the various pieces of parameter information is input via the management operation unit, a suction level transition graph indicating temporal transition of a data group of the suction level indicated by the suction level data is displayed simultaneously with the suction position offset distribution and the loading position offset distribution.

6. The component mounting system according to claim 2, wherein the management controller is configured to control the management display such that, when the command to select the one or more specific position offset data from a data group of a transition graph displayed in the management display is input via the management operation unit, with the suction position offset distribution and the loading position offset distribution, and at least one transition graph of the suction position offset transition graph and the loading position offset transition graph simultaneously displayed in the management display, the attention data corresponding to the specific position offset data is displayed in a different display mode from the display mode of the residual data in the data groups of a transition graph when the transition graph different from the transition graph subjected to the command by the management operation unit is displayed in the management display, and the suction position offset distribution and the loading position offset distribution.

7. The component mounting system according to claim 6, wherein the management communication unit is configured to acquire, from the mounting apparatus, suction level data indicating a suction level of the component by the suction nozzle in the component suction process, the management storage is configured to accumulate and store data that is further associated with the suction level data as the management data, and the management controller is configured to control the management display such that, when the command to select the one piece of parameter information from the various pieces of parameter information is input via the management operation unit, a suction level transition graph indicating temporal transition of a data group of the suction level indicated by the suction level data is displayed simultaneously with the suction position offset distribution and the loading position offset distribution.

8. The component mounting system according to claim 2, wherein the management communication unit is configured to acquire, from the mounting apparatus, suction level data indicating a suction level of the component by the suction nozzle in the component suction process, the management storage is configured to accumulate and store data that is further associated with the suction level data as the management data, and the management controller is configured to control the management display such that, when the command to select the one piece of parameter information from the various pieces of parameter information is input via the management operation unit, a suction level transition graph indicating temporal transition of a data group of the suction level indicated by the suction level data is displayed simultaneously with the suction position offset distribution and the loading position offset distribution.

9. The component mounting system according to claim 2, wherein the management communication unit is configured to acquire, from the mounting apparatus, suction state data indicating whether a suction state of the component by the suction nozzle in the component suction process is normal, the management storage is configured to accumulate and store data that is further associated with the suction state data as the management data, the management controller is configured to calculate a normal suction rate indicating a proportion of a number of times of use in a situation where the suction state is normal to a total number of times of use in a designated period about each of the component, the feeder, the suction nozzle, and the loading head indicated by the various pieces of parameter information based on the suction state data, and the management controller is configured to control the management display such that, when the command to select the one or more specific position offset data from the data group of one position offset distribution is input via the management operation unit, with the suction position offset distribution and the loading position offset distribution simultaneously displayed in the management display, the normal suction rate in each of the component, the feeder, the suction nozzle, and the loading head indicated by the various pieces of parameter information corresponding to the specific position offset data is displayed.

10. The component mounting system according to claim 1, wherein the management communication unit is configured to acquire, from the mounting apparatus, suction level data indicating a suction level of the component by the suction nozzle in the component suction process, the management storage is configured to accumulate and store data that is further associated with the suction level data as the management data, and the management controller is configured to control the management display such that, when the command to select the one piece of parameter information from the various pieces of parameter information is input via the management operation unit, a suction level transition graph indicating temporal transition of a data group of the suction level indicated by the suction level data is displayed simultaneously with the suction position offset distribution and the loading position offset distribution.

11. The component mounting system according to claim 10, wherein the management controller is configured to control the management display such that, when the command to select the one or more specific position offset data from the data group of one position offset distribution of the suction position offset distribution and the loading position offset distribution is input via the management operation unit, with the suction position offset distribution, the loading position offset distribution, and the suction level transition graph simultaneously displayed in the management display, the attention data corresponding to the specific position offset data is displayed in a different display mode from the display mode of the residual data in the data groups of another position offset distribution and the suction level transition graph.

12. The component mounting system according to claim 1, wherein the management communication unit is configured to acquire, from the mounting apparatus, suction state data indicating whether a suction state of the component by the suction nozzle in the component suction process is normal, the management storage is configured to accumulate and store data that is further associated with the suction state data as the management data, the management controller is configured to calculate a normal suction rate indicating a proportion of a number of times of use in a situation where the suction state is normal to a total number of times of use in a designated period about each of the component, the feeder, the suction nozzle, and the loading head indicated by the various pieces of parameter information based on the suction state data, and the management controller is configured to control the management display such that, when the command to select the one or more specific position offset data from the data group of one position offset distribution is input via the management operation unit, with the suction position offset distribution and the loading position offset distribution simultaneously displayed in the management display, the normal suction rate in each of the component, the feeder, the suction nozzle, and the loading head indicated by the various pieces of parameter information corresponding to the specific position offset data is displayed.

* * * * *